(12) United States Patent
Lee

(10) Patent No.: US 11,658,682 B2
(45) Date of Patent: May 23, 2023

(54) METHODS FOR ENCODING AND DECODING SPARSE CODE AND ORTHOGONAL SPARSE SUPERPOSITION CODE

(71) Applicant: POSTECH Research and Business Development Foundation, Pohang-si (KR)

(72) Inventor: Namyoon Lee, Pohang-si (KR)

(73) Assignee: POSTECH Research and Business Development Foundation, Pohang-si (KR)

(*) Notice: Subject to any disclaimer, the term of this patent is extended or adjusted under 35 U.S.C. 154(b) by 198 days.

(21) Appl. No.: 17/129,725

(22) Filed: Dec. 21, 2020

(65) Prior Publication Data

US 2021/0351791 A1 Nov. 11, 2021

(30) Foreign Application Priority Data

Apr. 28, 2020 (KR) ........................ 10-2020-0051796

(51) Int. Cl.
*H03M 13/25* (2006.01)
*H03M 13/05* (2006.01)
*H04L 1/00* (2006.01)

(52) U.S. Cl.
CPC ......... *H03M 13/05* (2013.01); *H03M 13/251* (2013.01); *H04L 1/0057* (2013.01)

(58) Field of Classification Search
CPC ...... G06F 3/0613; G06F 1/206; G06F 3/0653; G06F 3/0659; G06F 3/0673; G06F 11/1068; G06F 1/3275; G06F 11/1048; G11C 7/04; Y02D 10/00; H03M 13/05; H03M 13/251; H03M 13/13; H03M 13/451; H04L 1/0057; H04L 27/3488; H04L 1/0041; H04L 1/0045
USPC ........................................................ 714/752
See application file for complete search history.

(56) References Cited

U.S. PATENT DOCUMENTS

| | | | | |
|---|---|---|---|---|
| 8,069,395 | B2* | 11/2011 | Deierling | H03M 13/17 714/763 |
| 8,135,082 | B2* | 3/2012 | Choi | H04L 1/0071 375/264 |
| 8,782,499 | B2* | 7/2014 | Jeong | H03M 13/6393 714/790 |
| 11,424,529 | B2* | 8/2022 | Ryu | H01Q 1/22 |
| 2010/0122143 | A1* | 5/2010 | Lee | H04J 13/0003 714/752 |
| 2011/0138255 | A1* | 6/2011 | Lee | H03M 13/458 714/752 |

(Continued)

FOREIGN PATENT DOCUMENTS

TW 201633757 A * 9/2016

*Primary Examiner* — Albert Decady
*Assistant Examiner* — Enam Ahmed
(74) *Attorney, Agent, or Firm* — Morgan, Lewis & Bockius LLP

(57) ABSTRACT

The inventive concept relates to method for encoding and decoding sparse codes and orthogonal sparse superposition codes. A sparse code encoding method which is to be performed by an encoding apparatus, according to an embodiment of the inventive concept may include selecting an index set that is a part of a code block by using an information bit, and mapping a codeword less than a preset size to the selected index set.

12 Claims, 25 Drawing Sheets

(56) References Cited

U.S. PATENT DOCUMENTS

| | | | |
|---|---|---|---|
| 2012/0213299 A1* | 8/2012 | Cronie | H04L 1/0045 |
| | | | 375/259 |
| 2013/0272444 A1* | 10/2013 | Barron | H04L 1/0052 |
| | | | 375/295 |
| 2017/0076143 A1* | 3/2017 | Sapiro | G06K 9/627 |
| 2019/0274054 A1* | 9/2019 | Salem | H04L 12/189 |
| 2020/0213032 A1* | 7/2020 | Yeo | H04L 27/26 |
| 2020/0396486 A1* | 12/2020 | He | H04N 19/64 |
| 2021/0235119 A1* | 7/2021 | Kim | H04N 19/12 |

\* cited by examiner

It Is Possible To Generate Codeword
Having Length Of 8 From Total 10 Bits

METHODS FOR ENCODING AND DECODING SPARSE CODE AND ORTHOGONAL SPARSE SUPERPOSITION CODE

CROSS-REFERENCE TO RELATED APPLICATIONS

A claim for priority under 35 U.S.C. § 119 is made to Korean Patent Application No. 10-2020-0051796 filed on Apr. 28, 2020, in the Korean Intellectual Property Office, the entire contents of which are hereby incorporated by reference.

BACKGROUND

Embodiments of the inventive concept described herein relate to a method of encoding and decoding sparse codes and orthogonal sparse superposition codes.

In conventional channel codes, forward error correction has been used. Codes developed over the past 70 years are algebraic codes, and include a low density parity check (LDPC) code, a polar code, and a convolutional code.

When a code block length is sufficiently large M, there is a code that achieves the Shannon limit. For example, there are the polar code, the turbo code, the LDPC code, and the like. When the block length is short, the theoretical limit cannot be reached.

On the other hand, in recent years, in 5G/6G communication requiring higher rates and lower latency, the importance of good channel codes in an environment where the code block length is less than several hundreds of bits compared to the conventional block length is gradually increasing. For example, a factory automation system such as an IoT (Internet of Things) device mainly transmits control information acquired by sensors. Here, in most cases, the number of information bits is several hundred bits or less. In this case, the code block length is about several hundreds of bits.

In an environment where the code block length is less than several hundreds of bits, first, good channel codes should meet requirement of a small computation amount of encoding. The computation amount of encoding is linearly proportional to a block length. Second, a hamming distance between codewords needs to be large. The larger the distance between codewords, the higher the coding gain. Third, an average power for transmitting one codeword needs to be small. The smaller the average power, the higher the power gain. Fourth, the computation amount of code decoding needs to be simple. The computation amount of code decoding is linearly proportional to the block length.

In addition, a 6G THz wireless communication system is provided as another background of the inventive concept. A communication system that uses the THz (300 GHz or higher) frequency range belongs to a communication environment in which communication power is limited (power-limited communication regime) due to the broadband characteristics, high signal attenuation, and the absence of a high output power amplifier. As low-rate channel codes developed in a way to achieve the Shannon limit, there is Reed-Muller codes and Biothogonal codes. However, the decoding complexity of these codes does not have linear characteristics with respect to the code block length, causing a problem that the codes are not suitable for use in THz communication systems with very long code blocks.

SUMMARY

Embodiments of the inventive concept provide methods of encoding and decoding a sparse code and a sparse superposition code to obtain a coding gain and a power gain at the same time in a short block length.

However, the problem to be solved of the inventive concept is not limited thereto, and may be variously expanded even in an environment within a range not departing from the spirit and scope of the inventive concept.

According to an exemplary embodiment, a sparse code encoding method which is to be performed by an encoding apparatus may include selecting an index set that is a part of a code block by using an information bit, and mapping a codeword less than a preset size to the selected index set.

The selecting of the index set may include selecting a plurality of code positions using the information bit.

The mapping of the codeword may include mapping the codeword less than the preset size to a union or subset of the selected index set.

Further, according to an exemplary embodiment, an orthogonal sparse superposition code encoding method which is to be performed by an encoding apparatus, may include selecting an index set from a code block using information bits in successively encoding the information bits in a plurality of layers, and sequentially selecting a next index set from remaining code blocks except a previous index set used in a previous layer, sequentially generating a plurality of subcodewords by allocating modulation symbols to index sets selected by the layers respectively, and generating a sparse superposition code by combining the generated plurality of subcodewords.

When the plurality of subcodewords are sequentially generated, a next subcodeword may maintain orthogonality with a previous subcodeword.

When the plurality of subcodewords are sequentially generated, a next subcodeword may maintain near-orthogonality with a previous subcodeword.

The sequentially selecting of the next index set may include generating a projection matrix corresponding to the previous index set used in the previous layer, and when energy is less than a preset delta in a case where the generated projection matrix is projected, using a corresponding index as the next index set.

The sequentially selecting of the next index set may include controlling a degree of superposition interference by adjusting the delta value.

The sequentially selecting of the next index set includes sequentially selecting an index set for each section in a code block which has been divided into a plurality of sections in successively encoding information bits in a plurality of layers.

Further, according to an exemplary embodiment, a sparse code decoding method which is to be performed by a decoding apparatus may include sorting reception signals in an order of size, detecting a preset number of uppermost or lowermost index sets from the reception signals sorted in the order of size, and performing decoding on a sparse code by using a reception signal carried on the detected index set.

The performing of the decoding may include detecting a subcodeword by allocating a corresponding modulation symbol to an element of the detected index set.

The performing of the decoding may include determining a modulation symbol corresponding to the element of the detected index set and detecting a subcodeword by allocating the determined modulation symbol.

Further, another embodiment of the inventive concept, an orthogonal sparse superposition code decoding method which is to be performed by a decoding apparatus may include detecting a support set that is a non-zero position from a reception signal, identifying a set of subcodewords from the detected support set, and performing decoding on the identified set of subcodewords.

The identifying of the set of subcodewords may include identifying the set of subcodewords through comparison in size of probabilities belonging to each index set.

The performing of the decoding may include determining a modulation symbol corresponding to an element of the identified set of subcodewords and detecting a subcodeword by allocating the determined modulation symbol.

The detecting of the support set may include sequentially detecting a support set that is a non-zero position for each section from a reception signal which has been divided into a plurality of sections.

The detecting of the support set may include sequentially detecting a next support set that is a non-zero position from remaining reception signals except a previous support set used in a previous section.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
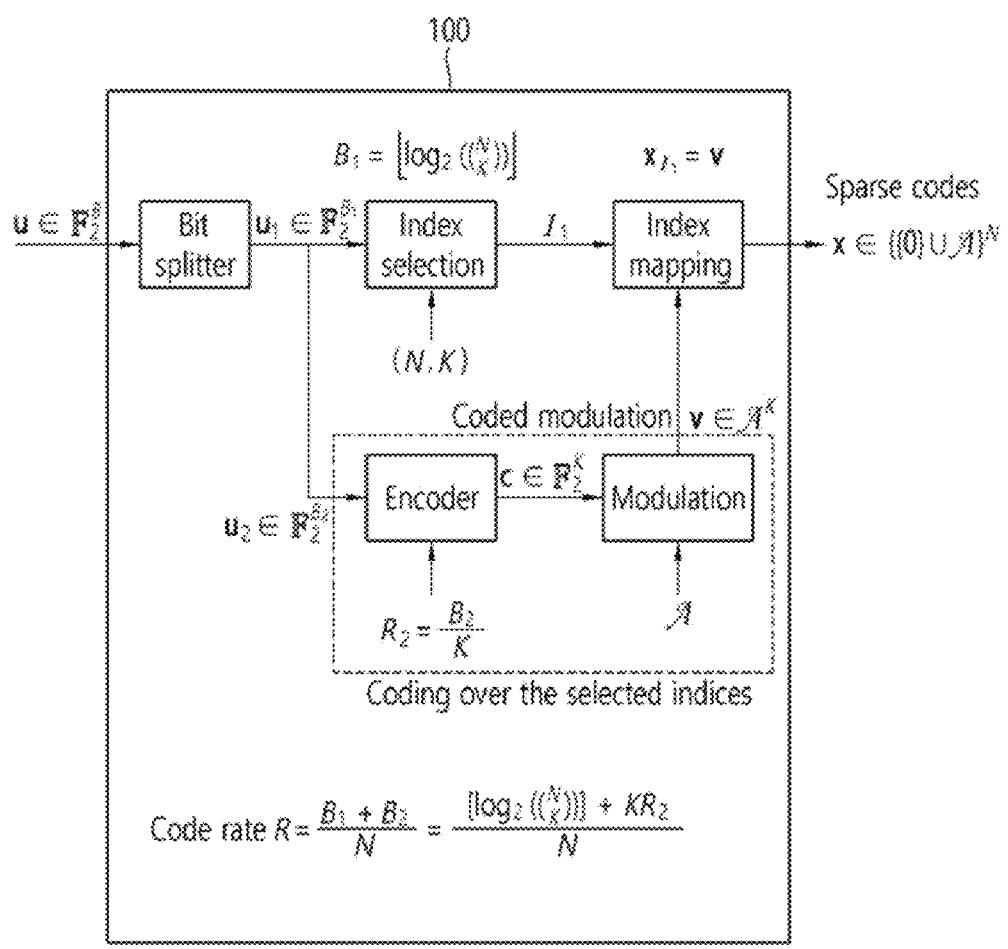
FIG. 1 is a diagram illustrating an operation of an encoding apparatus for sparse codes according to an embodiment of the inventive concept.

The inventive concept may apply various transformations and have various embodiments, and specific embodiments will be illustrated in the drawings and described in detail in the detailed description. However, this is not intended to limit the inventive concept to a specific embodiment, and it may be understood to include all conversions, equivalents, or substitutes included in the technical spirit and scope of the inventive concept. In the following description of the inventive concept, detailed description of known related arts will be omitted when it is determined that the gist of the inventive concept may be unnecessarily obscured.

The terms such as 'first', 'second', or the like may be used to denote various components, but the components are not limited by the terms. The terms are used merely for the purpose to distinguish a component from the other component.

Terms used in the disclosure are used to describe specified embodiments and are not intended to limit the scope of the inventive concept. The terms used in the inventive concept have been selected from among general terms that are currently widely used as possible while taking functions of the inventive concept into consideration, but this may vary according to the intention, precedent, or the emergence of new technologies of the skilled person in the field. In addition, in certain cases, there are terms arbitrarily selected by the applicant, and in this case, the meaning of the terms will be described in detail in the description of the corresponding invention. Therefore, the terms used in the inventive concept should be defined based on the meaning of the term and the overall contents of the inventive concept, not a simple name of the term.

As used herein, singular forms may include plural forms as well unless the context clearly indicates otherwise. It will be further understood that the terms "comprise," "comprising," "having," "include," "including" and/or variations thereof, when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the inventive concept will be described in detail with reference to the accompanying drawings, and in the description with reference to the accompanying drawings, the same or corresponding components are allocated with the same reference numbers, and redundant descriptions thereof will be omitted.

Before describing embodiments of the inventive concept, relevant terms and the like will be described.

$N \in \mathbb{Z}^+$ means the block length of a code. $x_\ell = [x_{\ell,1}, x_{\ell,2}, \ldots, x_{\ell,N}]^T$ is a sparse message vector.

Furthermore, a set of signal levels for the element of $X_\ell$ is defined. $J_\ell$ is the number of non-zero signal levels that may be allocated to $x_\ell$ for $\ell \in [L]$. In addition, the signal level set for a non-zero value of the $\ell \in [L]$-th codeword vector is as shown in [Equation 1].

$$\mathcal{A}_\ell = \{a_{\ell,1}, a_{\ell,2}, \ldots, J_\ell, a_\ell\} \quad \text{[Equation 1]}$$

where, $a_{\ell,i} \neq 0$ and $|\mathcal{A}_\ell| = J_\ell$ for $i \in [J_\ell]$.

$\mathcal{A}$ is defined as a union of L signal level sets, that is, $\mathcal{A} = \cup_{\ell=1}^{L}$ is generally selected from an arbitrary pulse amplitude modulation (PAM) signal set. A multi-level modulation set is defined as in [Equation 2] by the union of L signal level sets.

$$\mathcal{A} = \cup_{\ell=1}^{L} \mathcal{A}_\ell \quad \text{[Equation 2]}$$

For example, in the case of L=2, $\mathcal{A}_1 = \{1, -1\}$ and $\mathcal{A}_2 = \{2, -2\}$, the multi-level signal set becomes $\mathcal{A} = \{-2, -1, 1, 2\}$.

Next, an index subset and a support set will be described. A subset $\mathcal{N}_\ell$ is defined as in [Equation 3] for $\ell \in [L]$.

$$\mathcal{N}_\ell \subseteq \{1, 2, \ldots, N\} \quad \text{[Equation 3]}$$

Here, $|\mathcal{N}_\ell| \leq N$ for $l \in [L]$. In addition, for $l \in [L]$, the support set of $X_\ell$ is defined by [Equation 4].

$$\mathcal{I}_\ell = \{n | x_{\ell,n} \in \mathcal{A}_\ell\} \quad \text{[Equation 4]}$$

The cardinality of $\mathcal{I}_\ell$ is set to $K_\ell$, that is, $|\mathcal{I}_\ell| = K_\ell$ for $l \in [L]$.

Thus, the $l \in [L]$th subcodeword vector $x_l$ is a sparse vector, that is, $\|x\|_0 = K_\ell$ for $l \in [L]$.

An arbitrary set of supports for satisfies two characteristics.

As a first characteristic, $\mathcal{I}_\ell$ is a subset of $\mathcal{N}_\ell$, that is, $\mathcal{I}_\ell \subset \mathcal{N}_\ell$.

As a second feature, all support sets are mutually exclusive. That's $\mathcal{I}_i \cap \mathcal{I}_j = \emptyset$ for all $i, j \in [L]$.

The second characteristic denotes $\mathcal{N}_\ell \cap \{\cup_{j=1}^{\ell-1} \mathcal{I}_j\} = \emptyset$ for $\ell \in [L]$. The second characteristic is referred to as an orthogonal characteristic.

Information bit mapping and de-mapping will be described.

A function is considered, which maps an information bit vector $u_\ell$ with a length of $$B_\ell = \left\lfloor \log_2\left(\binom{|\mathcal{N}_\ell|}{K_\ell}\right) \right\rfloor + K_\ell \log_2(|\mathcal{A}_\ell|)$$

to $x_\ell$ by uniformly selecting the index $K_\ell$ in $\mathcal{N}_\ell$ and allocating signal levels $a_{\ell,i}$ to non-zero supports uniformly. This mapping function is defined by [Equation 5].

$$g_\ell : \{0,1\}^{B_\ell} \to \{0, \mathcal{A}_\ell\}^{|\mathcal{N}_\ell|} \quad \text{[Equation 5]}$$

Thus, each subcodeword is generated by $x_\ell = g_\ell(u_\ell)$. Similarly, there is a Bijection inverse mapping from $x_\ell$ to $u_\ell$, that is, $u_\ell = g_\ell^{-1}(x_\ell)$ for $\ell \in [L]$.

FIG. 1 is a diagram illustrating an operation of an encoding apparatus for sparse codes according to an embodiment of the inventive concept.

An encoding apparatus 100 for sparse codes according to an embodiment of the inventive concept may map information bits to an index of a vector. In this case, the encoding apparatus 100 may map a codeword having another size less than a preset size to an index set to generate a sparse code. To this end, the encoding apparatus 100 may map a codeword having a specific very small length to the selected index set while using the information bits to select a part of a code block.

As shown in FIG. 1, the encoding apparatus 100 may divide an information bit u into an information bit $u_1$ having a length of $B_1$ and an information bit $u_2$ having a length of $B_2$. u, $u_1$ and $u_2$ may satisfy, $u \in \mathbb{F}_2^B$, $u_1 \in \mathbb{F}_2^{B_1}$ and $u_2 \in \mathbb{F}_2^{B_2}$, respectively.

In addition, the encoding apparatus 100 may select K index sets from among N elements having a code block length using the information bits $u_1$. The selected index sets may represent a $\mathcal{I}_1$ support set that is a non-zero position.

In addition, the encoding apparatus 100 may generate a codeword $c \in \mathbb{F}_2^K$ using the information bit $u_2$ through an encoder. The encoding apparatus 100 may perform modulation by allocating a modulation symbol $\mathcal{A}$ to the generated codeword c to generate $v \in \mathcal{A}^K$.

Further, the encoding apparatus 100 may generate a sparse code x by mapping the codeword v to the selected support set $\mathcal{I}_1$. v and x may satisfy $$v \in \mathcal{A}^K, x_{\mathcal{I}_1} = v, \text{ and } x \in \{\{0\} \cup \mathcal{A}\}^N$$

$$\text{satisfy } R = \frac{B_1 + B_2}{N} = \frac{\left\lfloor \log_2\left(\binom{N}{K}\right) \right\rfloor + KR_2}{N}.$$

A code rate may

Figure 2:
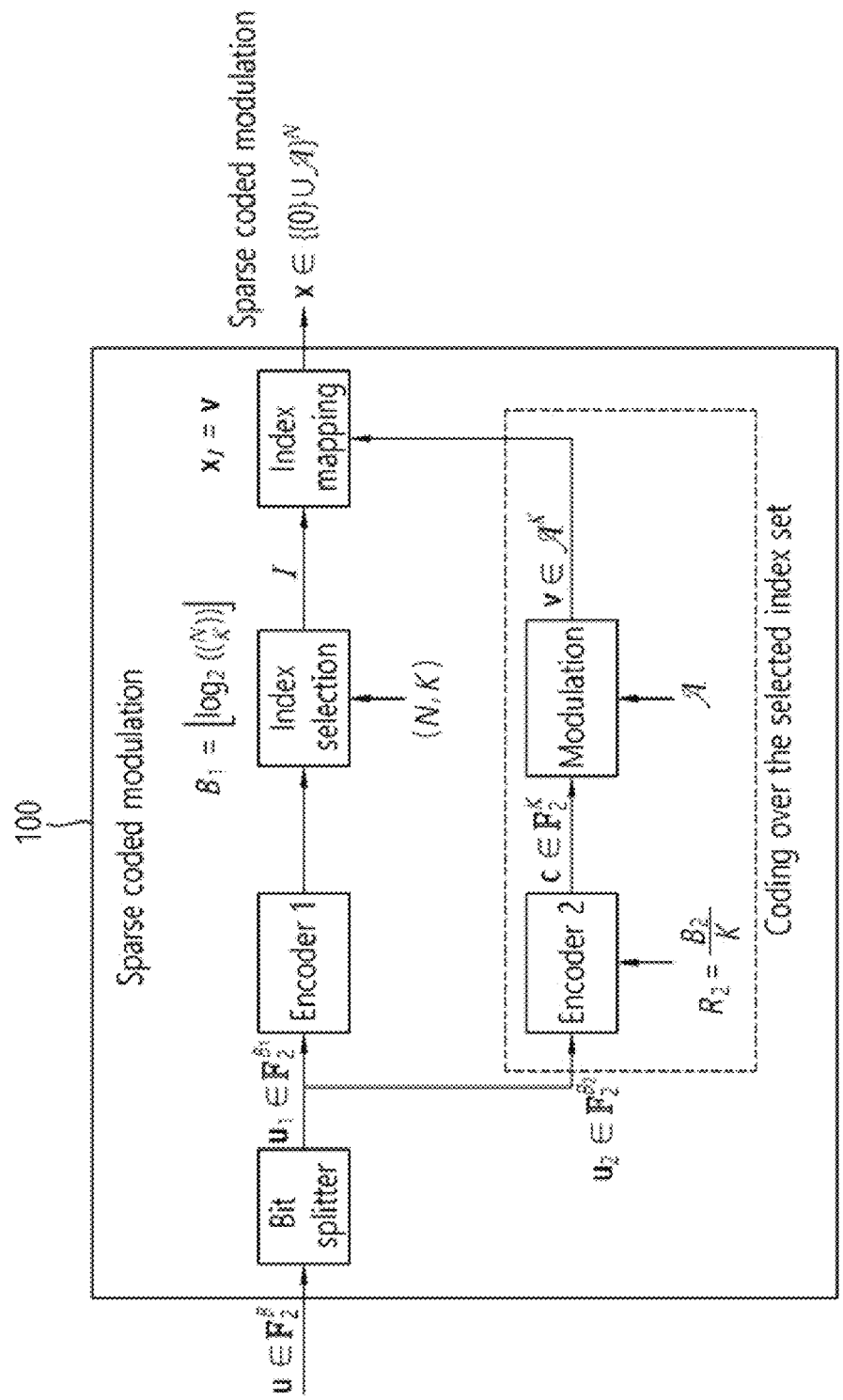
FIGS. 2 and 3 are diagrams for describing an operation of an encoding apparatus for sparse codes according to another embodiment of the inventive concept.
Figure 3:
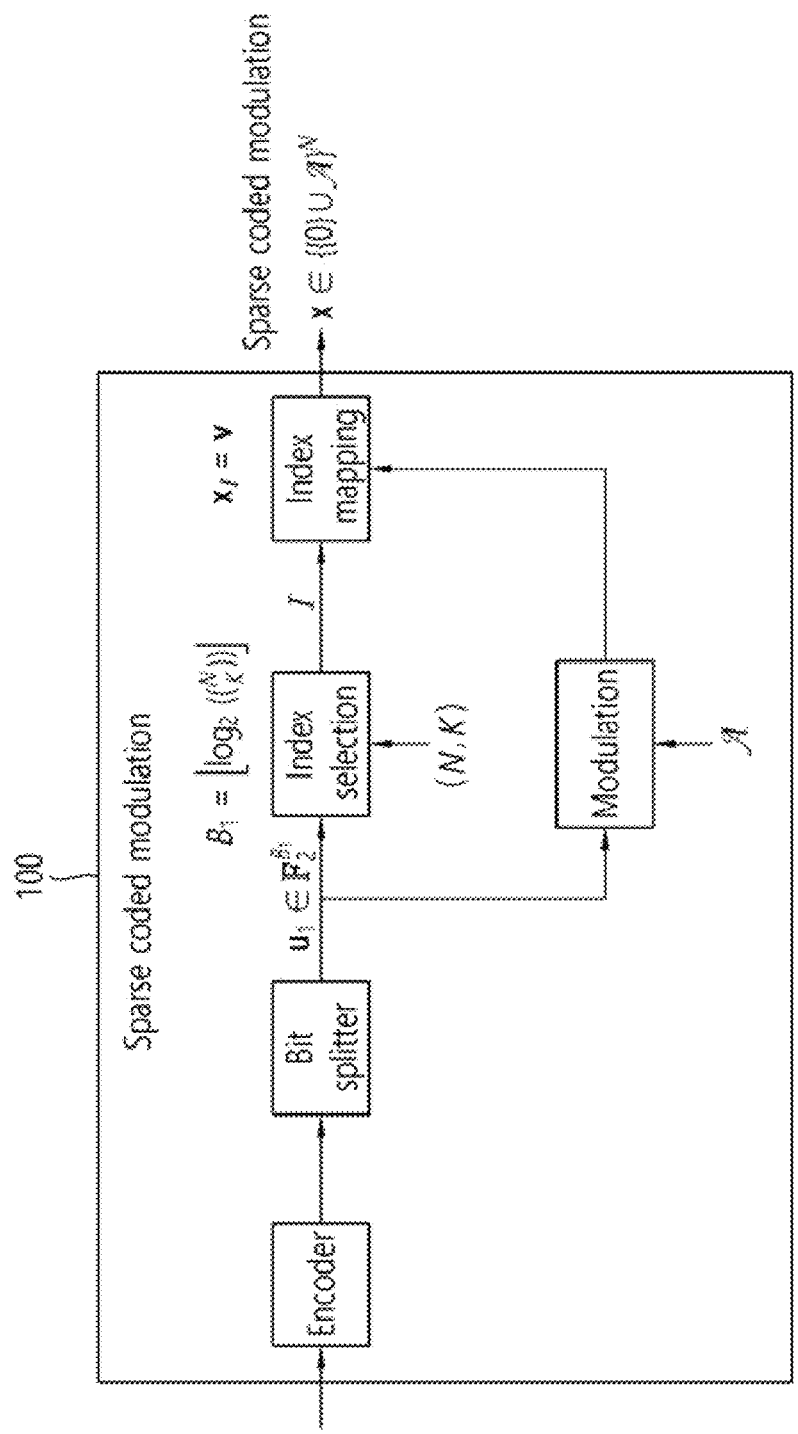

FIGS. 2 and 3 are diagrams for describing an operation of an encoding apparatus for sparse codes according to another embodiment of the inventive concept.

Compared with FIG. 1, the encoding apparatus 100 for sparse codes according to another embodiment of the inventive shown in FIG. 2 may perform sparse coded modulation. The encoding apparatus 100 may further includes a first encoder (Encoder 1). The first encoder may encode information bits $u_1$. The encoding apparatus 100 may select K index sets from among N elements having a code block length by using the encoded information bits $u_1$. A second encoder (Encoder 2) may generate a codeword c from the information bits $u_2$ through an encoder as in FIG. 1.

Compared with FIG. 1, the encoding apparatus 100 for sparse codes according to another embodiment of the inventive shown in FIG. 3 may perform sparse coded modulation. The encoding apparatus 100 may perform encoding through an encoder in advance before dividing the information bits. Then, the encoded information bits u are divided into encoded information bits $u_1$ and encoded information bits $u_2$. Further, the encoding apparatus 100 may select K index sets from among N elements having a code block length by using the encoded information bits $u_1$. In addition, the encoding apparatus 100 may perform modulation using the encoded information bits $u_2$.

Figure 4:
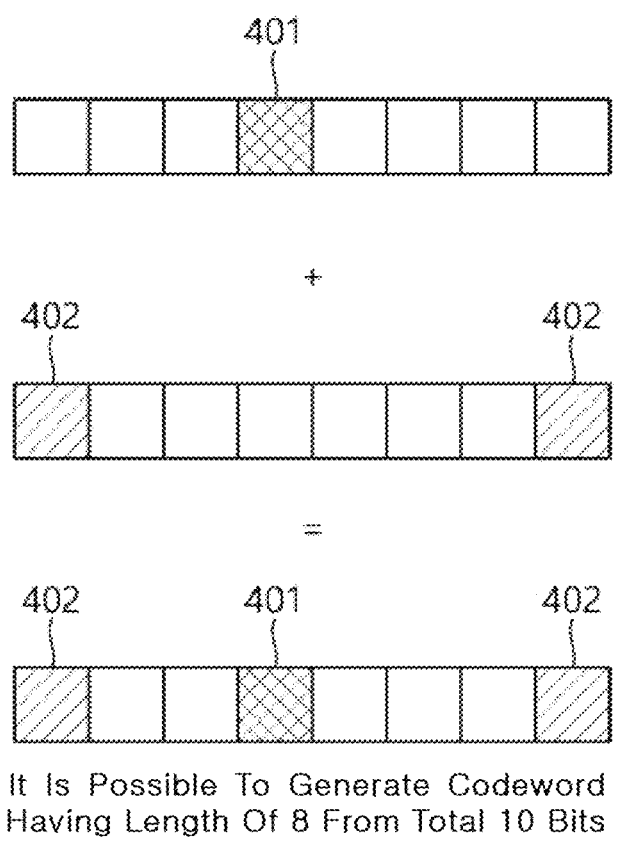
FIG. 4 is a diagram for describing an orthogonal sparse superposition code according to another embodiment of the inventive concept.

FIG. 4 is a diagram for describing an orthogonal sparse superposition code according to another embodiment of the inventive concept.

Orthogonal sparse superposition coding according to another embodiment of the inventive concept is to a method of mapping information by superposition several sparse codes in several layers so as not to interfere with each other.

Orthogonal sparse superposition coding according to another embodiment of the inventive concept is to combine L different sparse codes of a number of layers so as not to superpose each other. To this end, successive support elimination encoding is performed.

Referring to FIG. 4, an example of a method of superposing two codewords each having a codeword length of 8 will be described. A total of 10 bits may be generated as a codeword having a length of 8.

The first subcodeword is generated. One of eight indices is selected as a fourth element. Here, the amount of information is 3 bits. The selected fourth element is mapped to a black symbol set 401. In the case of Binary Phase Shift Keying (BPSK), the amount of information is 1 bit.

A second subcodeword is generated. Information is mapped in a method for selecting two of the remaining seven elements except the fourth element used in the first subcodeword. Two of the seven indices are selected as first and seventh elements. Here, the amount of information is 4 bits. The selected first and seventh elements are mapped to a red symbol set 402. In the case of BPSK, the amount of information is a total of 2 bits.

Figure 5:
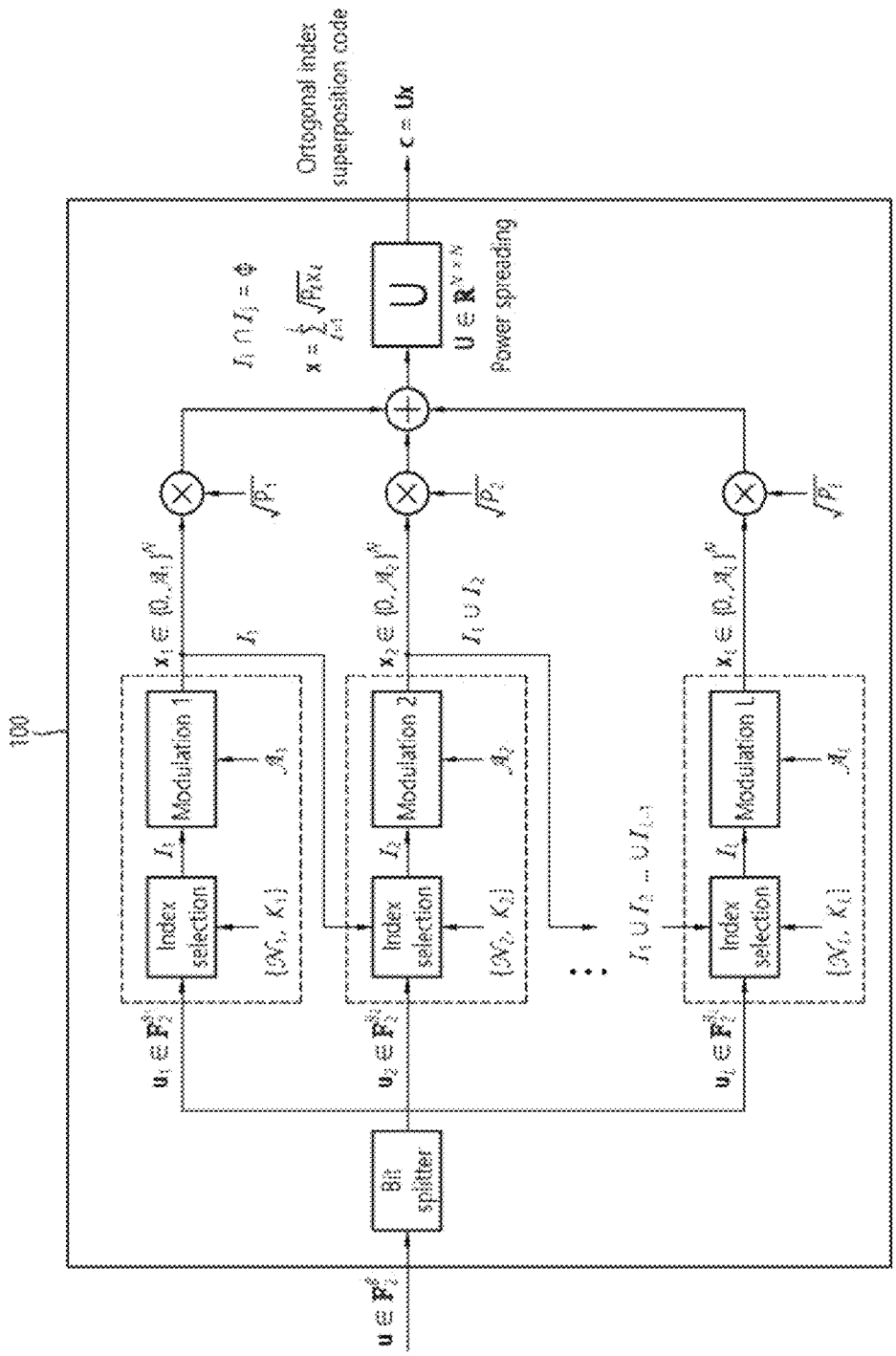
FIG. 5 is a diagram illustrating an operation of an encoding apparatus for orthogonal sparse superposition codes according to another embodiment of the inventive concept.

FIG. 5 is a diagram illustrating an operation of an encoding apparatus for orthogonal sparse superposition codes according to another embodiment of the inventive concept.

The encoding apparatus 100 for orthogonal sparse superposition codes according to another embodiment of the inventive concept may continuously perform a modulation operation of superposing information on L layers without interference with each other.

As shown in FIG. 5, the encoding apparatus 100 may continuously map codewords to L different subcodewords. Index sets respectively selected in layers are mutually exclusive. The encoding operation may consist of L phases (L phases).

Specifically, the encoding apparatus 100 may divide a codeword U into a codeword $u_1$, a codeword $u_2$, ... and a codeword $u_L$. $u$, $u_1$, $u_2$, and $u_L$ may satisfy $u \in \mathbb{F}_2^B$, $u_1 \in \mathbb{F}_2^{B_1}$, $u_2 \in \mathbb{F}_2^{B_2}$, ..., $u_L \in \mathbb{F}_2^{B_L}$, respectively.

In the first phase, the encoding apparatus 100 may select $K_1$ index sets from among $|\mathcal{N}_1|$ elements to encode the codeword $u_1$ into a sparse vector $x_1$. The selected index sets may represent a support set $\mathcal{I}$ that is a non-zero position. In addition, the encoding apparatus 100 may uniformly allocate the modulation symbols $\mathcal{A}_1$ to $K_1$ index sets that are non-zero of the subcodeword $x_1$ to finally generate the subcodeword $x_1$.

In the second phase, the encoding apparatus 100 may select $K_2$ index sets from among $|\mathcal{N}_2|$ elements that is a code block length using the codeword $u_2$. The selected index set represents a support set $\mathcal{I}_2$ that is a non-zero position. Herein, $\mathcal{N}_2$ includes unselected remaining indices other than the support set $\mathcal{I}_1$ selected when generating a subcodeword $x_1$. $\mathcal{N}_2$ may satisfy $\mathcal{N}_2 = [N] \backslash \mathcal{N}_1$. In addition, the encoding apparatus 100 may generate a subcodeword $x_2$ by uniformly allocating the modulation symbols $\mathcal{A}_2$ to $K_2$ index sets that are non-zero of the subcodeword $x_2$.

Thereafter, the encoding apparatus 100 may successfully apply the same principle up to the Lth phase.

In the last phase, the encoding apparatus 100 may select $K_L$ index sets from among $|\mathcal{N}_L|$ elements that is a code block length by using a codeword $u_L$. The selected index sets may represent a support set $\mathcal{I}_L$ that is a non-zero position. Herein $\mathcal{N}_L$ may include unselected remaining indices other than the support sets $\mathcal{I}_1, \mathcal{I}_2, \ldots, \mathcal{I}_{L-1}$ selected when generating subcodewords $x_1, x_2, \ldots, x_{L-1}$. $\mathcal{N}_L$ may satisfy $$\mathcal{N}_\ell \cap \left\{ \bigcup_{j=1}^{\ell-1} \mathcal{I}_j \right\} = \emptyset.$$

In addition, the encoding apparatus 100 may generates a subcodeword $x_L$ by uniformly allocating the modulation symbols $\mathcal{A}_L$ to $K_L$ index sets that are non-zero of the subcodeword $x_L$. With this configuration, the support sets of subcodewords are mutually exclusive ( $\mathcal{I}_i \cap \mathcal{I}_j = \emptyset$).

When the encoding apparatus 100 generates L subcodewords, the codewords are configured by superposition of the L subcodewords. $P_l$ may be defined as power allocated to the l-th subcodeword. The orthogonal index superposition code is as shown in [Equation 6] below.

$$x = \sum_{\ell=1}^{L} \sqrt{P_\ell} x_\ell \qquad \text{[Equation 6]}$$

In Equation 6, $\sum_{\ell=1}^{L} P_\ell = P$. Further, the support set that is non-zero of x is an union. That is, $\mathcal{I}$ may be equal to [Equation 7] below.

$$\mathcal{I} = \bigcup_{\ell=1}^{L} \mathcal{I}_\ell \qquad \text{[Equation 7]}$$

In Equation 7, $$\|x\|_0 = \sum_{\ell=1}^{L} K_\ell \leq N.$$

The encoding apparatus 100 may use a unitary transform $U \in \mathbb{R}^{N \times N}$ to obtain a pre-coded codeword vector (c=Ux) in order to spread transmit power over use of N channels. The unitary matrix may be advantageous in reducing the Peak-to-Average-Power-Ratio (PAPR) in hardware implementations.

Meanwhile, the decoding possibility will be described.

The orthogonal index superposition code may be decoded, when all power-weighted non-zero signal levels are different, that is, when non-zero signals level of $\mathcal{A}_\ell$ and $\mathcal{A}$ are uniquely present, $a_{l,i} \notin \cup_{j \neq i} \mathcal{A}_j$. In the case of noise-free, when a decoding apparatus 200 observes $$x = \sum_{\ell=1}^{L} x_\ell,$$

the decoding apparatus 200 may identify L different subcodewords using a set of modulated signal levels $\mathcal{A}_\ell$ that are distinct for uniquely determined $\ell$. After that, the decoding apparatus 200 may perrform inverse mapping from $\mathcal{X}_\ell$ to $\mathcal{U}_\ell$ to obtain information bits $\mathcal{B}_\ell$, that is, $\mathcal{U}_\ell = g_\ell^{-1}(\mathcal{X}_\ell)$ for $\ell$.

The code rate will be described. The $\ell$ th subcodeword may carry information bits $\mathcal{B}_\ell$ using N channels. The code rate of the $\ell$ th codeword may be expressed as in [Equation 8].

$$R_\ell = \frac{B_\ell}{N} \qquad \text{[Equation 8]}$$

As a result, the rate of the orthogonal index superposition code may be expressed as in [Equation 9].

$$R = \frac{\sum_{\ell=1}^{L} B_\ell}{N} \qquad \text{[Equation 9]}$$

The encoding method according to the embodiments of the inventive concept may generate a code having a very flexible rate by appropriately selecting code parameters including N, L, $\mathcal{N}_\ell$, $\mathcal{K}_\ell$, $\sqrt{P_\ell}$ and $\mathcal{A}_\ell$ for $\ell$. For a given code rate $$R = \frac{\sum_{\ell=1}^{L} B_\ell}{N}$$

and the block length N, the code parameters may be optimized to minimize decoding errors.

The average transmit power will be described. The average transmit power for orthogonal index superposition codes may be calculated. It should be noted that the number of codewords for $\mathbf{X}_\ell$ is $2^{N R_\ell}$, and the codewords are evenly distributed for $\ell$. Therefore, the average power of $\mathbf{X}_\ell$ may be expressed as in [Equation 10].

$$\mathbb{E}[\|x_\ell\|_2^2] = \frac{K_\ell \sum_{i=1}^{|\mathcal{A}_\ell|} a_{\ell,i}^2}{N} \qquad \text{[Equation 10]}$$

Since each subcodeword vector is independently generated, the average power of x may be expressed as in [Equation 11].

$$E_s = \mathbb{E}[\|x\|_2^2] = \frac{\sum_{\ell=1}^{L} K_\ell \sum_{i=1}^{|\mathcal{A}_\ell|} a_{\ell,i}^2}{|\mathcal{A}_\ell| N} \qquad \text{[Equation 11]}$$

In order to minimize the average transmit power, the encoding parameters $a_{\ell,i}$, $\mathcal{N}_\ell$ and $\mathcal{K}_\ell$ should be carefully selected.

The minimum distance of the code will be described. $P_1 = \ldots = P_L$ is assumed. A codebook with a size of $2^{NR}$ may be represented by $$C = \{c^1, c^2, \ldots, c^{2^{NR}}\}.$$

$c^j$ is the jth codeword of the orthogonal index superposition code. The minimum distance of the codebook may be defined by [Equation 12].

$$d_{min}(C) = \min_{i,j \in [2^{NR}]} \|c^i - c^j\|_2 \qquad \text{[Equation 12]}$$

Here, a coding gain of $$\gamma c(C) = \frac{d_{min}^2(C)}{E_b} = \frac{d_{min}^2(C)}{E_s/(2R)}$$

is obtained.

Some examples of coding schemes according to embodiments of the inventive concept will be described.

Example 1: For ease of description, attention is paid to the symmetric case of [N, L]=[48, 2] and $K_1=K_2=2$. Further, two PAM sets $\mathcal{A}_1=\{-1, 1\}$ and $\mathcal{A}_2=\{-2, 2\}$ having the same power allocation $P_1=P_2=1$ are considered. In this example, an orthogonal index superposition code having a rate of R=1/2 and a block length of 48, that is, [N, K]=[48, 24] is constructed. The encoding apparatus 100 may generate four subcodeword vectors using a successive non-superposition index superposition method. The encoding apparatus 100 may map $$B_1 = \left\lfloor \log_2\left( \binom{48}{2} 2^2 \right) \right\rfloor = 12$$

information bits to $x_1$ by selecting two non-zero positions and allocating them to 1 or −1 uniformly. In the second stage, the encoding apparatus 100 may map $$B_2 = \left\lfloor \log_2\left( \binom{46}{2} 2^2 \right) \right\rfloor = 12$$

information bits to $x_2$ by selecting two non-zero positions in the index set that do not overlap the index set $\mathcal{I}_1$, that is, the index set $\mathcal{N}_2 = [N] \setminus \mathcal{I}_1$. The encoding apparatus 100 may uniformly allocate 2 or −2 to non-zero elements in $x_2$. Since each subcodeword has a ternary alphabet, the superposition code may become [Equation 13].

$$c = x_1 + x_1 \in \{-2,-1,0,1,2\}^{48}$$

This code has an alphabetical size of 5 and the codeword is sparse (i.e. $\|c\|_0 = 4$). The normalized average transmit power per channel use becomes [Equation 14].

$$E_s = \frac{\mathbb{E}[\|x\|_2^2]}{N} = \frac{4}{48} = \frac{2}{48} = \frac{1}{8} \qquad \text{[Equation 14]}$$

Since the minimum distance of this code is 2, the normalized minimum distance may be given by [Equation 15].

$$\frac{d_{min}^2}{E_s/(2R)} = \frac{2}{1/8} = 16 \qquad \text{[Equation 15]}$$

This example may demonstrate that an average transmit power per channel of an orthogonal index superposed code may be very small compared to a conventional coding scheme with binary phase shift keying modulation. For example, in the case of a convolutional code with [N, K]=[48, 24], the normalized average transmit power is 1.

On the other hand, to further emphasize the importance of the code construction method, several will be described.

Referring to the orthogonal characteristic, the most prominent characteristic of the orthogonal index superposition code guarantees the orthogonal characteristic, indicating that all support sets are mutually exclusive, that is, $\mathcal{I}_i \cap \mathcal{I}_j = \emptyset$ for all i, j∈[L]. This characteristic makes it easy to perform decoding in a computationally efficient manner. In addition, the characteristic may not be obtained from other conventional sparse superposition codes or conventional superposition codes. This orthogonality in the selection of the support set is achieved by a continuous multi-phase encoding scheme according to embodiments of the inventive concept.

Referring to the simple and deterministic code structure, unlike the conventional sparse superposition codes, orthogonal index superposition coding is expressed using a dictionary matrix defined by [Equation 16].

$$c = [I_N \ I_N \ \ldots \ I_N] \begin{bmatrix} x_1 \\ x_2 \\ \vdots \\ x_L \end{bmatrix}$$ [Equation 16]

When using orthogonal sparse superposition codes, a sense matrix should be carefully selected to ensure the decoding possibilities. By selecting elements of the sense matrix from Gaussian to ensure the restricted isometry property (RIP), decoding is possible with high probability detection. However, orthogonal superposition coding according to embodiments of the inventive concept may guarantee decoding possibility without any probability factor.

Without losing generality, an orthogonal index superposition code may be generated as shown in [Equation 17] by concatenating a single matrix U L times.

$$c = [U \ U \ \ldots \ U] \begin{bmatrix} x_1 \\ x_2 \\ \vdots \\ x_L \end{bmatrix}$$ [Equation 17]

With respect to joint information mapping, a method of individually mapping information bits to L subvectors $X_\ell$ for $\ell$ may be provided. However, this information mapping may be performed jointly. For ease of expression, when [|$\mathcal{N}_1$|, |$\mathcal{N}_2$|, ..., |$\mathcal{N}_L$|,]=[N, N−K, ..., N−(L−1)K,] and $a_{\ell,j}$=A are assumed, it is possible to generate the same number of possible codewords as that of [Equation 18].

$$\prod_{\ell=1}^{L} \binom{N-(\ell-1)K}{K} A^K$$ [Equation 18]

Therefore, the code rate may be increased as shown in [Equation 19].

$$R = \frac{\left\lfloor \log_2 \left( \prod_{\ell=1}^{L} \binom{N-(\ell-1)K}{K} A^K \right) \right\rfloor}{N}$$ [Equation 19]

When the difference from the permutation modulation code is considered, one interesting connection is that the classical permutation modulation code is a special case of an orthogonal index superposition code with joint information bit mapping technique. Specifically, it is possible to generate the same codebook with a modified codebook with joint mapping by setting a signal level set to a singleton $\mathcal{A}_\ell = \{a_{\ell,1}\}$ for $\ell$ which achieves the speed of $$R = \frac{\left\lfloor \log_2 \left( \prod_{\ell=1}^{L} \binom{N-(\ell-1)K}{K} A^K \right) \right\rfloor}{N}.$$

Due to the degree of freedom for designing a signal level per subcodeword and the additional information bit mapping of non-zero elements, the encoding method according to embodiments of the inventive concept may generate more codewords for given M and K. In addition, since the superposition encoding method for a plurality of subcodewords reduces the encoding complexity due to a separate bit mapping technique, it is easy to actually implement the encoding apparatus 100.

Looking at the difference from index modulation, the coding scheme according to embodiments of the inventive concept may also generalize the existing index modulation method. Single-layer encoding, that is, L=1 is assumed. This method is the same as index modulation. Accordingly, the coding scheme according to embodiments of the inventive concept may be interpreted as a multiplexing method of multi-layered index modulated signals in an orthogonal manner.

Figure 6:
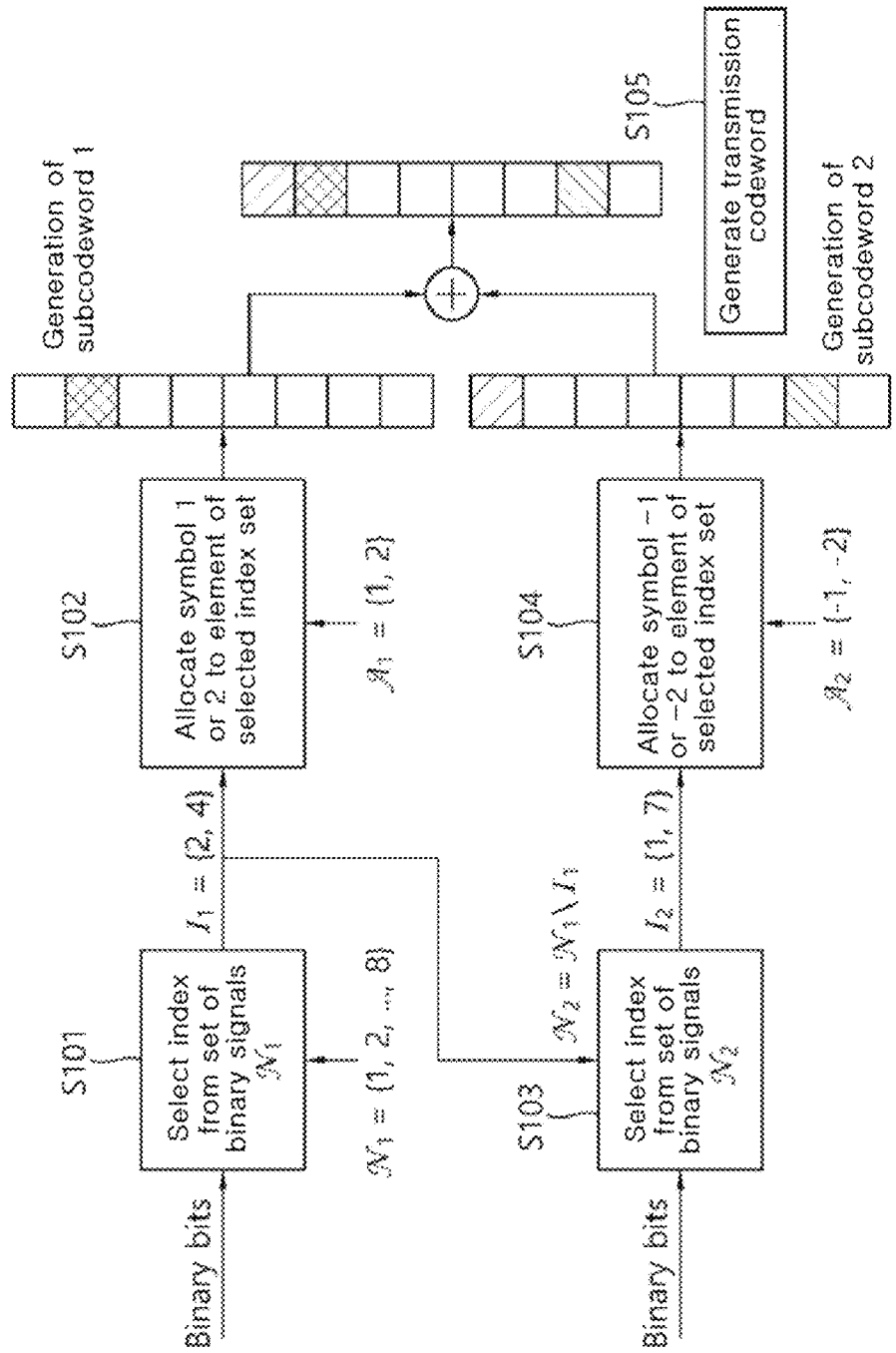
FIG. 6 is a flowchart for describing an encoding method for orthogonal sparse superposition codes according to another embodiment of the inventive concept.

FIG. 6 is a flowchart for describing an encoding method for an orthogonal sparse superposition code according to another embodiment of the inventive concept.

The encoding apparatus 100 may receive binary bits and select an index from a set of binary signals $\mathcal{N}_1$ (S101). Here, the support set $\mathcal{I}_1$ may be $\mathcal{I}_1$={2, 4}.

The encoding apparatus 100 may allocate symbols 1 or 2 to the elements of a selected index set (S102) and generate a subcodeword 1, and $\mathcal{A}_1$={1, 2}.

Meanwhile, the encoding apparatus 100 may receive binary bits and select an index for a set of binary signals $M_2$ (S103). In this case, the set of $\mathcal{N}_2$ is $\mathcal{N}_2 = \mathcal{N}_1 \setminus \mathcal{I}_1$ and the remaining indices except the support set $\mathcal{I}_1$ are included. Here, the support set $\mathcal{I}_2$ is $\mathcal{I}_2$={1, 7}.

The encoding apparatus 100 may allocate symbols −1 or −2 to elements in the selected index set (S104), and generate a subcodeword 2, and $\mathcal{A}_2$={−1, −2}.

Further, the encoding apparatus 100 may generate a transmission codeword by superposing the generated subcodeword 1 and subcodeword 2 (S105).

Figure 7:
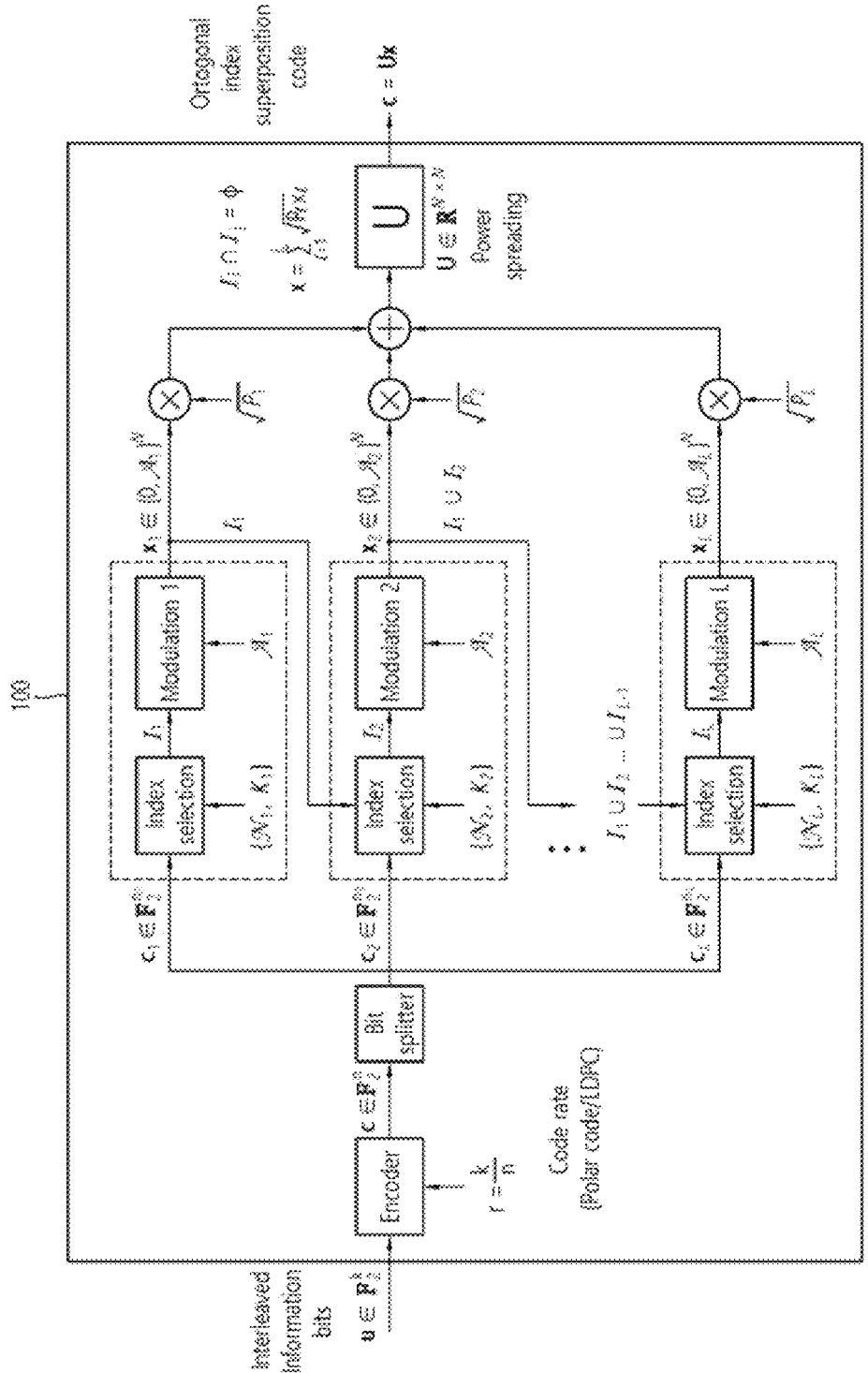
FIG. 7 is a diagram illustrating an operation of an encoding apparatus for orthogonal sparse superposition codes according to another embodiment of the inventive concept.

FIG. 7 is a diagram illustrating an operation of an encoding apparatus for an orthogonal sparse superposition code according to another embodiment of the inventive concept.

Compared with FIG. 5, the encoding apparatus 100 for an orthogonal sparse superposition code according to another embodiment of the inventive concept may further include an encoder. The encoding apparatus 100 may receive interleaved u information bits and generates a codeword "c" through the encoder. u and c satisfy u∈$\mathbb{F}_2^k$, c∈$\mathbb{F}_2^n$. Here, a code rate is $$r = \frac{k}{n}.$$

Thereafter, the encoding apparatus 100 may perform a successive modulation operation in which information is superposed onto L layers without interference with each other, like FIG. 5. The encoding apparatus 100 may successively map c codewords to L different subcodewords.

Figure 8:
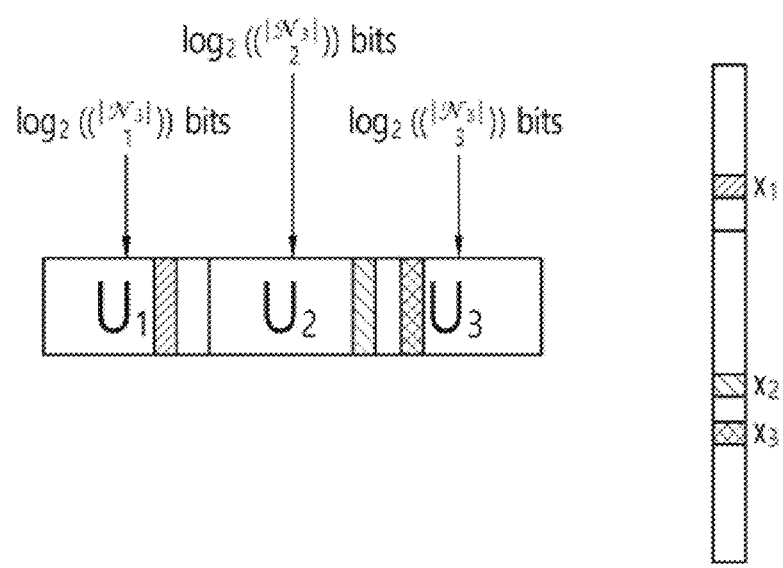
FIG. 8 is a diagram illustrating a successive encoding operation using precoding according to another embodiment of the inventive concept.

FIG. 8 is a diagram showing a successive encoding operation using precoding according to another embodiment of the inventive concept.

A near-orthogonal matrix $U_j$ may have $N_j$ columns. $U_j$ may be $U_j=[u_{j,1}, u_{j,2}, \ldots, u_{j,N_j}]$ and satisfy $U_j^H U_j = I+E$.

Referring to the example shown in FIG. 8, there are a matrix $U_1$ having $\log_2\left(\binom{N_1}{1}\right)$ bits, a matrix $U_2$ having $\log_2\left(\binom{|\mathcal{N}_2|}{1}\right)$ bits, and a matrix $U_3$ having $\log_2\left(\binom{|\mathcal{N}_3|}{1}\right)$ bits.

The encoding apparatus 100 may select a sixth column from the matrix $U_1$ having $N_1$ columns. Here $\mathcal{N}_1=[N_1]$ in the matrix $U_1$, and the support set is $\mathcal{I}_1=\{6\}$. In addition, the encoding apparatus 100 may generate a projection matrix $P_1$. The projection matrix $P_1$ is $$P_1 = I - \frac{u_{1,6} u_{1,6}^H}{u_{1,6}^H u_{1,6}}.$$

When the sixth column is selected from the matrix $U_1$, the encoding apparatus 100 may use a corresponding index when energy is less than or equal to a preset delta as in $\mathcal{N}_2 = \{j \mid \|P_1 u_{j,2}\|_2 \leq \delta\}$, $j \in [N_2]$ in a case where the generated projection matrix $P_1$ is projected. Here, when the energy is less than or equal to the delta, $\mathcal{N}_2 = \{1, 2, 4, 8\}$ in the matrix $U_2$. The degree of superposition interference may be controlled by adjusting the delta value. When the eighth column is selected, the support set is $\mathcal{I}_2 = \{8\}$ and $A_2 = [u_{1,6}, u_{2,8}]$. In addition, the encoding apparatus 100 may generate a projection matrix $P_2$. The projection matrix $P_2$ is $P_2 = I - A_2 (A_2^H A_2)^{-1} A_2^H$.

When the eighth column is selected from the matrix $U_2$, the encoding apparatus 100 may use a corresponding index when the energy is less than or equal to the delta as in $\mathcal{N}_3 = \{j \mid \|P_2 u_{3,j}\|_2 \leq \delta\}$, $j \in [N_3]$ in a case where the generated projection matrix $P_2$ is projected. Here, when the energy is less than or equal to the delta, $\mathcal{N}_3 = \{2, 7\}$ in the matrix $U_3$. When the second column is selected, the support set is $\mathcal{I}_3 = \{2\}$.

As described above, the successive encoding operation using precoding represents a method of superimposing and transmitting information while allowing partial interference in three layers for x1, x2 and x3 as in $x = u_{1,6} + u_{2,8} + u_{3,2}$.

Figure 9:
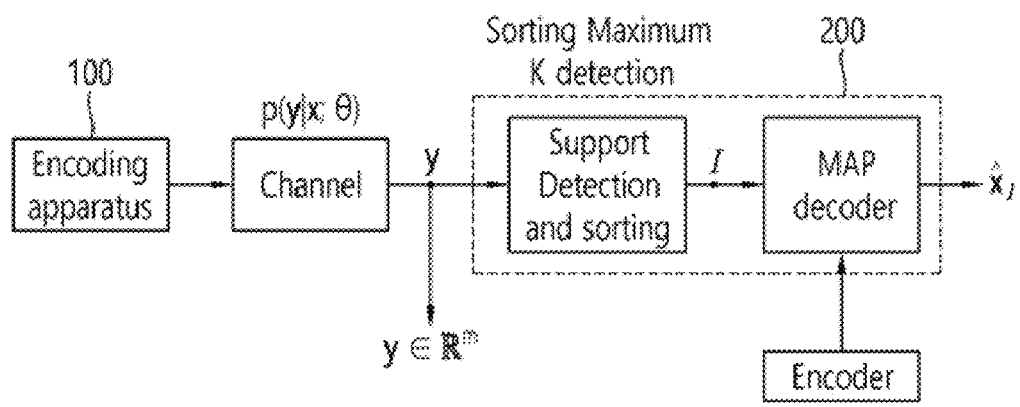
FIG. 9 is a diagram illustrating an operation of a decoding apparatus for sparse codes according to another embodiment of the inventive concept.

FIG. 9 is a diagram illustrating an operation of a decoding apparatus for sparse codes according to another embodiment of the inventive concept.

The decoding apparatus 200 for sparse codes according to another embodiment of the inventive concept has a two-stage structure.

First, the decoding apparatus 200 may find K indices having a large size of a reception signal.

In addition, the decoding apparatus 200 may sort the found indices in ascending order (descending order). Here, the indices may be arranged in a pattern promised with a transmitter.

Subsequently, the decoding apparatus 200 may decode small codes using only reception signals carried on the K indices found. The complexity of the decoding apparatus 200 may be linearly associated with a code length. Simplification is achieved by several tens of times compared to conventional decoding apparatuses.

Figure 10:
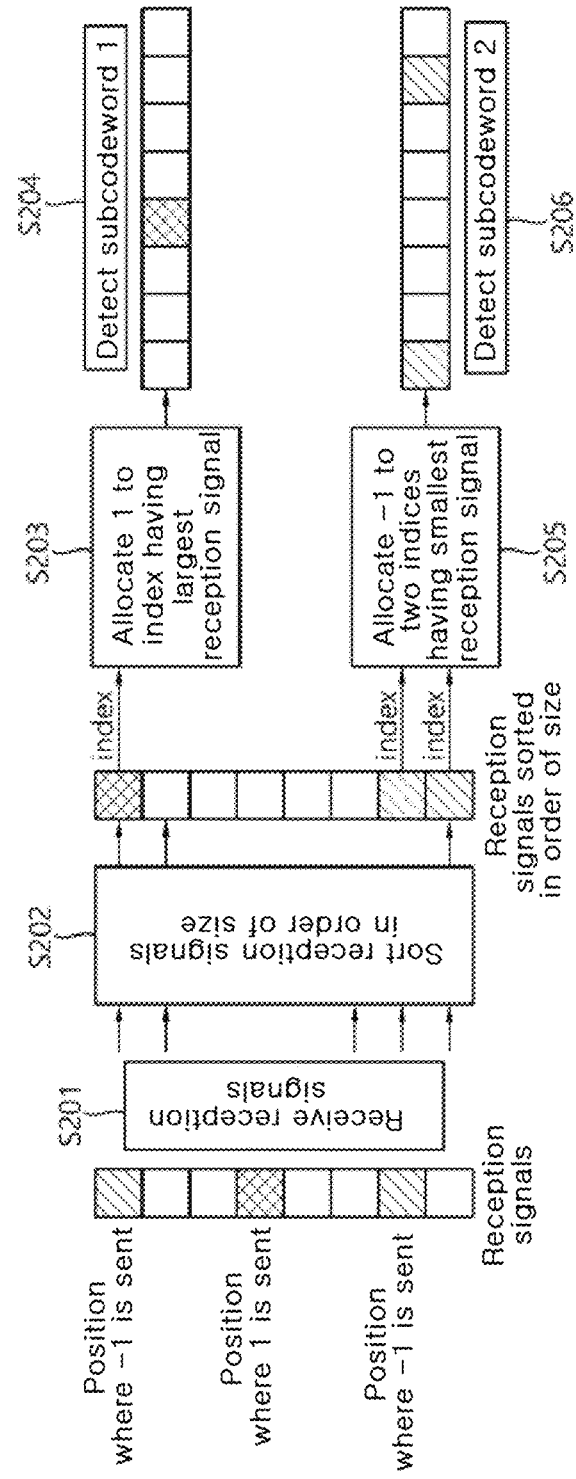
FIGS. 10 and 11 are diagrams illustrating an operation example of a decoding method for sparse codes according to another embodiment of the inventive concept.
Figure 11:
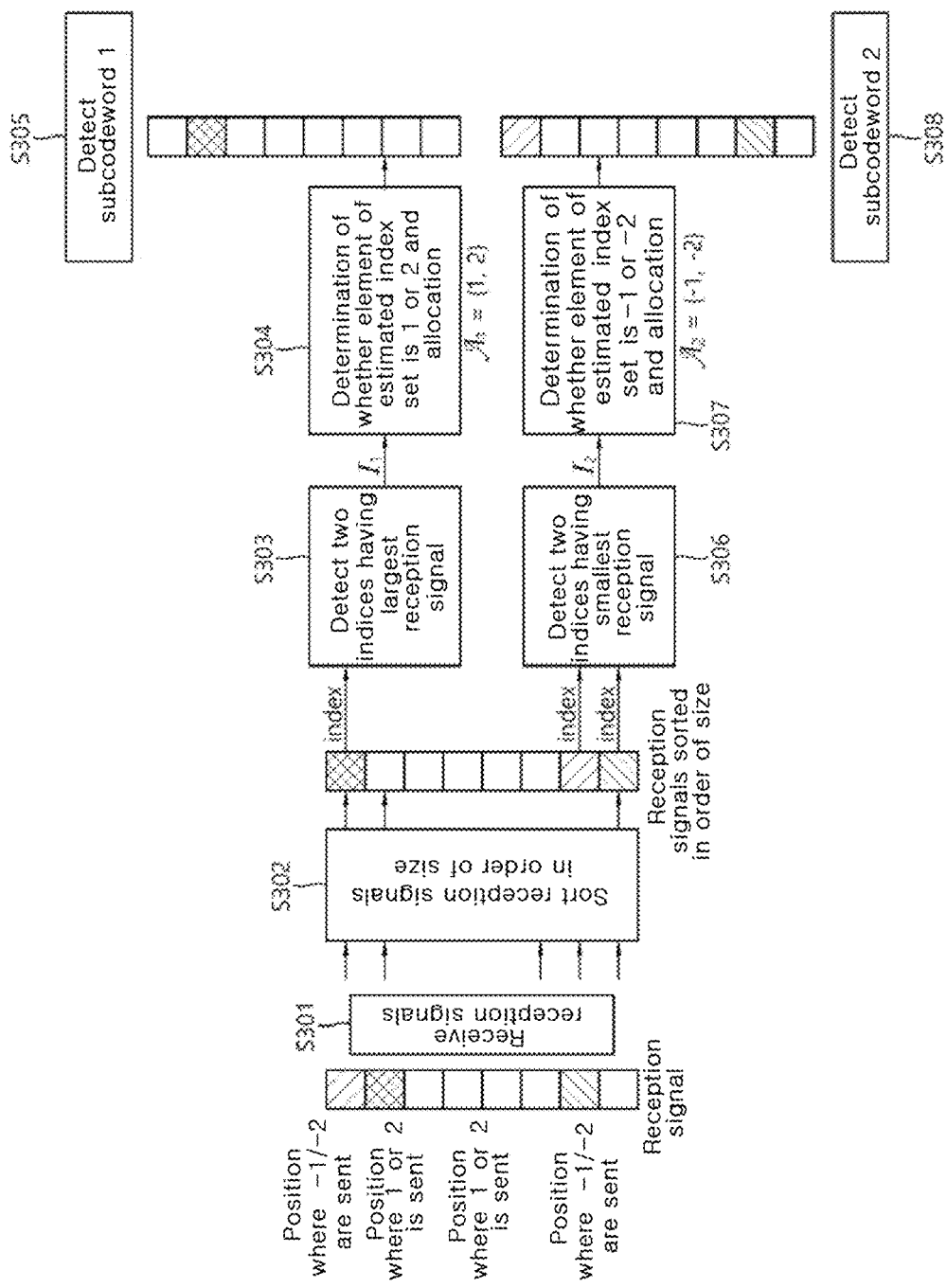

FIGS. 10 and 11 are diagrams illustrating an operation example of a decoding method for sparse codes according to another embodiment of the inventive concept.

As shown in FIG. 10, the decoding apparatus 200 may receive reception signals (S201). Looking at the reception signals, a position where 1 is sent is the fourth position, and a position where −1 is sent is the first position and the seventh position.

The decoding apparatus 200 may sort the reception signals in order of size (S202).

In addition, the decoding apparatus 200 may allocate symbol 1 to an index having the largest received signal sorted in order of size (S203), and detect subcodeword 1 (S204). The support set $\mathcal{I}_1$ is $\mathcal{I}_1 = \{4\}$ and $\mathcal{A}_1 = \{1\}$.

In addition, the decoding apparatus 200 may allocate symbol −1 to the index having the smallest received signal sorted in order of size (S205), and detect subcodeword 2 (S206). The support set $\mathcal{I}_2$ is $\mathcal{I}_2 = \{1, 7\}$ and $\mathcal{A}_2 = \{-1\}$. Thereafter, the decoding apparatus 200 may obtain information contained in each subcodeword detected and position information.

As shown in FIG. 11, the decoding apparatus 200 may receive a reception signal (S301). With respect to the reception signal, positions where 1 or 2 is sent are the second and fourth positions, and positions where −1 or −2 are sent are the first and seventh positions.

The decoding apparatus 200 may sort the reception signals in order of size (S302).

In addition, the decoding apparatus 200 may detect two indices having the largest reception signals sorted in order of size (S303). $\mathcal{I}_1 = \{2, 4\}$ is obtained.

Subsequently, the decoding apparatus 200 may determine whether elements of an estimated index set are symbol 1 or symbol 2, allocate the symbol to the corresponding element (S304), and detect subcodeword 1 (S305). $\mathcal{A}_1 = \{1, 2\}$ is obtained.

In addition, the decoding apparatus 200 may detect two indices having the smallest reception signals sorted in order of size (S306). The support set $\mathcal{I}_1$ is $\mathcal{I}_1 = \{2, 4\}$.

Subsequently, the decoding apparatus 200 may determine whether elements of the estimated index set are symbol 1 or symbol 2 among, allocate the symbol to the corresponding element (S307), and detect subcodeword 1 (S308). $\mathcal{A}_1 = \{1, 2\}$ is obtained. Thereafter, the decoding apparatus 200 may obtain information contained in each subcodeword detected and position information.

Figure 12:
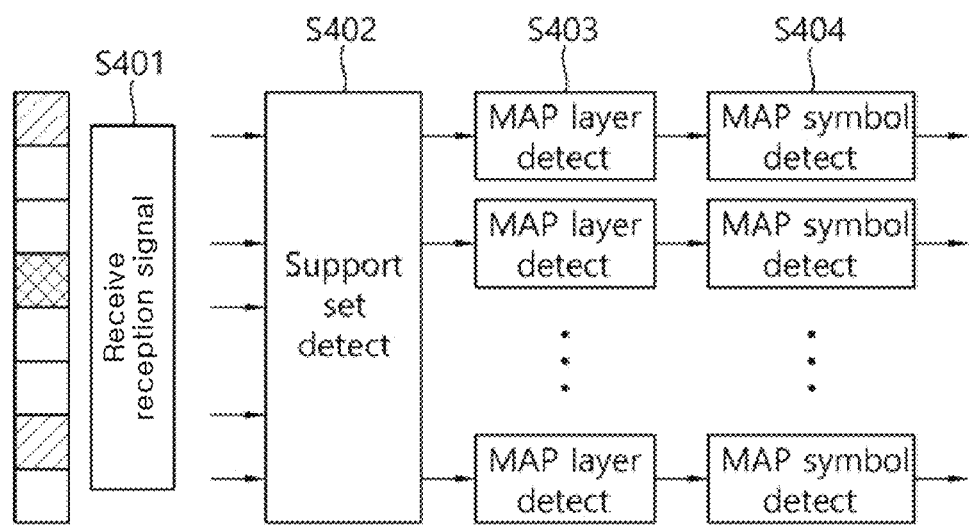
FIGS. 12 and 13 are diagrams illustrating an operation of a decoding apparatus for orthogonal sparse superposition code according to another embodiment of the inventive concept.
Figure 13:
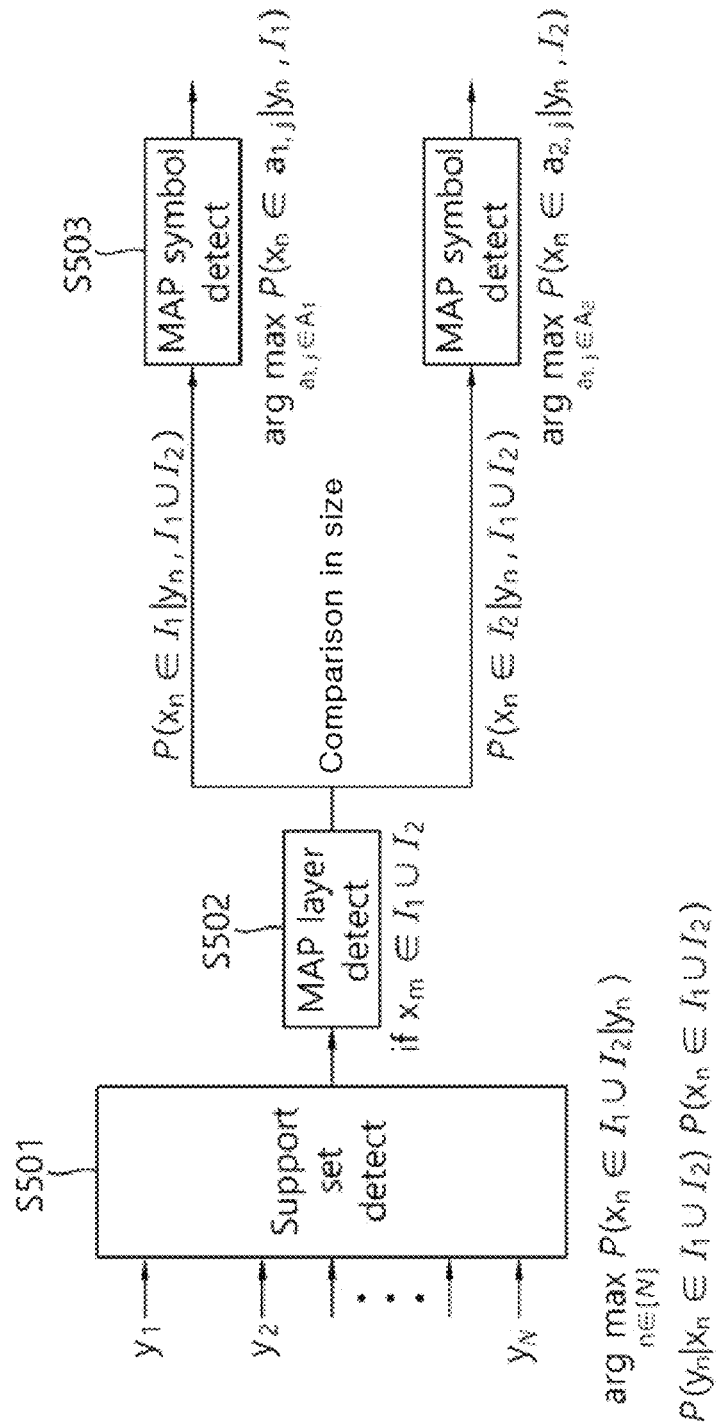

FIGS. 12 and 13 are diagrams illustrating an operation of a decoding apparatus for an orthogonal sparse superposition code according to another embodiment of the inventive concept.

As shown in FIG. 12, the decoding apparatus 200 may receive a reception signal (S401), and determine a reception signal that is at a non-zero position in the received reception signal through a support set detector (S402). Here, the decoding apparatus 200 may determine a reception signal that is at the non-zero position by using $$\arg\max_{n\in[N]} \; P(x_n \in \mathcal{I}_{,1} \cup \mathcal{I}_{,2} \mid y_n).$$

For example, the decoding apparatus 200 may determine that the first, fourth and seventh indices are not zero.

In addition, the decoding apparatus 200 may identify two sparse subcodes through a MAP layer detector in the case of non-zero positions (S403). That is, the decoding apparatus 200 may determine which subcodeword set is. Here, the decoding apparatus 200 may determine which subcodeword set is by using comparison in size between $P(x_n \in \mathcal{I}_1 \mid y_n, \mathcal{I}_1 \cup \mathcal{I}_2)$ and $P(x_n \in \mathcal{I}_2 \mid y_n, \mathcal{I}_1 \cup \mathcal{I}_2)$. For example, the decoding apparatus 200 may identify whether subcodewords correspond to the first and seventh indices or whether a subcodeword corresponds to the fourth index.

Subsequently, the decoding apparatus 200 may detect a subcodeword through a MAP symbol detector (S404). Here, the decoding apparatus 200 may detect a subcodeword using $$\arg\max_{a_{1,j}\in\mathcal{A}_1} P(x_n = a_{1,j} \mid y_n, \mathcal{I}_1), \arg\max_{a_{1,j}\in\mathcal{A}_2} P(x_n = a_{2,j} \mid y_n, \mathcal{I}_2),$$
$$\ldots, \arg\max_{a_{L,j}\in\mathcal{A}_L} P(x_n = a_{L,j} \mid y_n, \mathcal{I}_L).$$

For example, the decoding apparatus 200 may obtain information contained in each subcodeword and position information.

FIG. 13 is a diagram for again describing the operation illustrated in FIG. 12 again using a probability formula.

The decoding apparatus 200 may receive reception signals, calculate probability equations $P(y_n \mid x_n \in \mathcal{I}_1 \cup \mathcal{I}_2) P(x_n \in \mathcal{I}_1 \cup \mathcal{I}_2)$ for all N, and then find an index having a maximum value $K_1 + K_2$ as in $$\arg\max_{n\in[N]} \; P(x_n \in \mathcal{I}_1 \cup \mathcal{I}_2 \mid y_n). \quad (S501)$$

In addition, when $x_n$ belongs to the union of $\mathcal{I}_1$ and $\mathcal{I}_2$, the decoding apparatus 200 may find an index set $K_1$ that maximizes the probability expression $P(x_n \in \mathcal{I}_1 \mid y_n, \mathcal{I}_1 \cup \mathcal{I}_2)$, $P(y_n \mid x_n, \mathcal{I}_1 \cup \mathcal{I}_2) P(x_n \in \mathcal{I}_1 \mid x_n \in \mathcal{I}_1 \cup \mathcal{I}_2)$ (S502). In addition, the decoding apparatus 200 finds an index set $K_2$ that maximizes the probability equation $P(x_n \in \mathcal{I}_2 \mid y_n, \mathcal{I}_1 \cup \mathcal{I}_2)$.

In addition, the decoding apparatus 200 may detect a subcodeword through the MAP symbol detection operation using $$\arg\max_{a_{1,j}\in\mathcal{A}_1} P(x_n = a_{1,j} \mid y_n, \mathcal{I}_1). \quad (S503)$$

Also, the decoding apparatus 200 may detect a subcodeword through a MAP symbol detection operation using $$\arg\max_{a_{1,j}\in\mathcal{A}_2} P(x_n = a_{2,j} \mid y_n, \mathcal{I}_2).$$

Meanwhile, in relation to embodiments of the inventive concept, an element-wise maximum a posterior (MAP) decoding with successive support set cancellation (E-MAP-SSC) will be described. Embodiments of the inventive concept provides a low-complexity decoding algorithm, referred to as bit-wise maximum a posterior decoding with successive support set cancellation, with successive support set cancellation.

Figure 14:
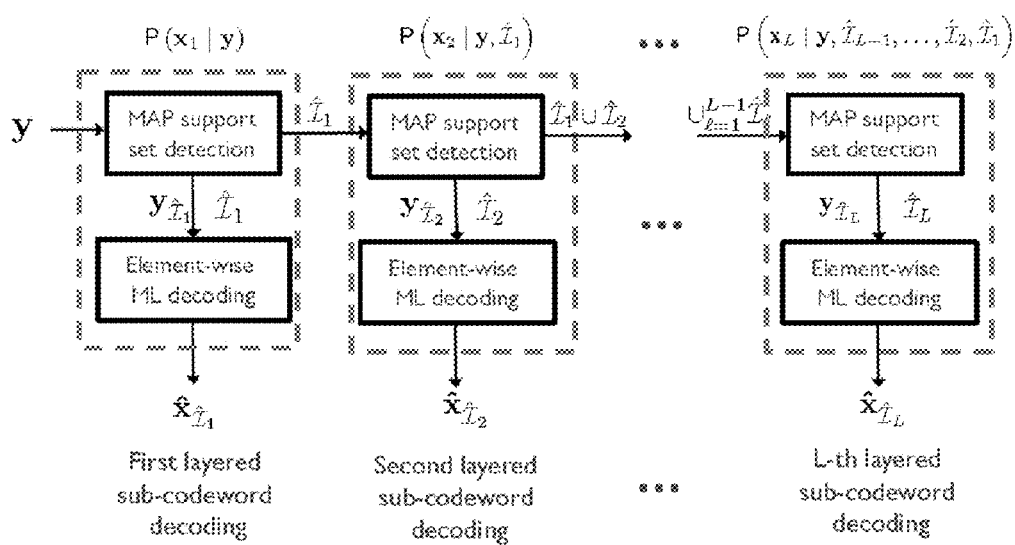
FIG. 14 is a diagram illustrating an operation of a decoding apparatus for an orthogonal sparse superposition code according to another embodiment of the inventive concept using a probability equation.

FIG. 14 is a diagram illustrating an operation of a decoding apparatus for an orthogonal sparse superposition code according to another embodiment of the inventive concept using a probability equation.

As shown in FIG. 14, the main idea of embodiments of the inventive concept is to successively decode subcodeword vectors $x_1$ at x to maximize a posterior probability (APP) using the Bayesian approach. It is noted that the joint APP is factored by [Equation 20].

$$P(x \mid y) = \prod_{\ell=1}^{L} P(x_\ell \mid y, x_{\ell-1}, \ldots, x_2, x_1) \quad \text{[Equation 20]}$$

From this decomposition, the decoding algorithm according to the embodiments of the inventive concept is to successively estimate subcodeword vectors. The B-MAP-SSC according to the embodiments of the inventive concept may perform iteration L times. Each iteration includes decoding a subcodeword vector and subtracting the support set of the decoded subcodeword to evolve the prior distribution for the next iteration. Specifically, in the first iteration, the decoding apparatus 200 may perform B-MAP decoding to identify the first support set $\mathcal{I}_1$. Since all the reception signals $y_m$ for $m \in [M]$ are independent, the joint APP is factored by [Equation 21].

$$P(x \mid y) = \prod_{n=1}^{N} P(x_n \mid y_n) \prod_{\ell=1}^{L} 1_{\{\sum_{n=1}^{N} 1_{\{x_n \in \mathcal{A}\}} = K_\ell\}} \quad \text{[Equation 21]}$$
$$= \prod_{n=1}^{N} \frac{P(y_n \mid x_n) P(x_n)}{P(y_n)} \prod_{\ell=1}^{L} 1_{\{\sum_{n=1}^{N} 1_{\{x_n \in \mathcal{A}\}} = K_\ell\}}$$

To calculate [Equation 21], the likelihood function given by [Equation 22] is needed.

$$P(y_n \mid x_n) = \frac{1}{\sqrt{2\pi\sigma^2}} \exp\left(-\frac{|y_n - x_n|^2}{2\sigma^2}\right) \quad \text{[Equation 22]}$$

Here, $x_n \in \{\{0\} \cup \{ \cup_{\ell=1}^{L} \mathcal{A}_\ell \}\}$. The prior distribution of x is also decomposed into [Equation 23].

$$P(x) = \frac{1}{Z} \prod_{n=1}^{N} P(x_n) \prod_{\ell=1}^{L} 1_{\{\sum_{n=1}^{N} 1_{\{x_n \in \mathcal{A}\}} = K_\ell\}} \quad \text{[Equation 23]}$$

In [Equation 23], $Z \in \mathbb{R}^+$ is the probability distribution constant, and $\mathbf{1}_c$ is the indicator function for the set c. $K_1$, $K_2, \ldots, K_L$ non-zero supports are selected uniformly at each $\mathcal{N}_1, \mathcal{N}_2, \ldots, \mathcal{N}_L$. Also, the non-zero elements of $x_\ell$ are uniformly selected in $\mathcal{A}_\ell$ for $\ell$. The probability mass function of $x_n$ may be expressed as in [Equation 24].

$$P(x_{\ell,n}) = \begin{cases} x_{\ell,n} = 0, & w.p.\ 1 - \dfrac{K_\ell}{N - \sum_{j=1}^{\ell-1} K_j} \\ x_{\ell,n} \in \mathcal{A}_\ell, & w.p.\ \dfrac{K_\ell}{N - \sum_{j=1}^{\ell-1} K_j} \end{cases} \quad \text{[Equation 24]}$$

Here, [Equation 25] may be obtained by calling the prior distribution $x_{\ell,n}$ in [Equation 24].

$$P(y_n) = \quad \text{[Equation 25]}$$
$$P(y_n \mid x_{\ell,n} \in \mathcal{A}_\ell) P(x_{\ell,n} \in \mathcal{A}_\ell) + P(y_n \mid x_{\ell,n} \notin \mathcal{A}_\ell) P(x_{\ell,n} \notin \mathcal{A}_\ell)$$

Using [Equation 22], [Equation 24], and [Equation 25], the decoding apparatus 200 may perform element-wise MAP support detection, that is, signal set detection, which is calculated by [Equation 26].

$$\begin{aligned} P(y_n) &= P(y_n \mid x_{\ell,n} \in \mathcal{A}_\ell) P(x_{\ell,n} \in \mathcal{A}_\ell) + \\ & \quad P(y_n \mid x_{\ell,n} \notin \mathcal{A}_\ell) P(x_{\ell,n} \notin \mathcal{A}_\ell) \\ &= \frac{1}{\sqrt{2\pi\sigma^2}} \sum_{j=1}^{|\mathcal{A}_\ell|} e^{-\frac{|y_n - x_{\ell,j}|^2}{2\sigma^2}} \frac{K_\ell}{N - \sum_{j=1}^{\ell-1} K_j} \frac{1}{|\mathcal{A}_\ell|} + \\ & \quad \frac{1}{\sqrt{2\pi\sigma^2}} e^{-\frac{|y_n|^2}{2\sigma^2}} \left(1 - \frac{K_\ell}{N - \sum_{j=1}^{\ell-1} K_j}\right) \end{aligned} \quad \text{[Equation 26]}$$

In addition, the decoding apparatus 200 may estimate the support set of $x_\ell$ using a reclusive algorithm. To describe the process of the reclusive algorithm in detail, it is assumed that the support set of $x_\ell$ is estimated in the $\ell$-th iteration step. In this case, the set of support sets estimated through the algorithm up to the previous step $\ell - 1$ is expressed by $\hat{\mathcal{I}}_1, \ldots, \hat{\mathcal{I}}_{\ell-1}$. Using the support set information $\hat{\mathcal{I}}_1, \ldots, \hat{\mathcal{I}}_{\ell-1}$ obtained in the previous step, in the $\ell$ th step, $\hat{\mathcal{I}}_\ell$ is identified through MAP decoding.

Then, the decoding apparatus 200 may have information of $$\hat{\mathcal{N}}_\ell = [N] \setminus \bigcup_{j=1}^{\ell-1} \hat{\mathcal{I}}_j.$$

Using this information, the decoding apparatus 200 may calculate the APP as in [Equation 27].

$$P(x_\ell \mid y, \hat{\mathcal{I}}_1, \ldots, \hat{\mathcal{I}}_{\ell-1}) = \quad \text{[Equation 27]}$$
$$\prod_{n \in \hat{\mathcal{N}}_\ell} \frac{P(y_n \mid x_{\ell,n}) P(x_{\ell,n})}{P(y_n)} \mathbf{1}_{\{\Sigma_{n \in \hat{\mathcal{N}}_\ell} \mathbf{1}_{\{x_{\ell,n} \in \mathcal{A}_\ell\}} = K_\ell\}}$$

In order to calculate [Equation 27], the information of [Equation 28] is needed.

$$P(y_n \mid x_{\ell,n} \in \mathcal{A}_\ell) = \frac{1}{|\mathcal{A}_\ell|} \sum_{j=1}^{|\mathcal{A}_\ell|} \frac{1}{\sqrt{2\pi\sigma^2}} \exp\left(-\frac{|y_n - a_{\ell,j}|^2}{2\sigma^2}\right) \quad \text{[Equation 28]}$$

In addition, the probability information for $x_\ell$ is decomposed as in [Equation 29]

$$P(x_\ell) = \frac{1}{Z} \prod_{n \in \hat{\mathcal{N}}_\ell} P(x_{\ell,n}) \mathbf{1}_{\{\Sigma_{n \in \hat{\mathcal{N}}_\ell} \mathbf{1}_{\{x_{\ell,n} \in \mathcal{A}_\ell\}} = K_\ell\}} \quad \text{[Equation 29]}$$

Finally, by combining [Equation 24], [Equation 26], and [Equation 24], the decoding apparatus 200 may calculate a probability value for the support set by [Equation 30].

$$P(n \in \mathcal{I}_\ell \mid y_n) = \frac{P(y_n \mid x_{\ell,n} \in \mathcal{A}_\ell) P(x_{\ell,n} \in \mathcal{A}_\ell)}{P(y_n)} \quad \text{[Equation 30]}$$

Thereafter, the decoding apparatus 200 may estimate the support set of $x_\ell$ in the $\ell$-th iteration as the largest $K_\ell$ $\hat{\mathcal{I}}_\ell = \{\hat{i}_{\ell,1}, \hat{i}_{\ell,2}, \ldots, \hat{i}_{\ell, K_\ell}\}$ using [Equation 31].

$$P(\hat{i}_{\ell,1} \in \mathcal{I}_\ell \mid y_{\ell,1}) > P(\hat{i}_{\ell,2} \mathcal{I}_\ell \mid y_{\ell,2}), \ldots \quad \text{[Equation 31]}$$

The decoding apparatus 200 may estimate a signal level of $x_{\ell,n}$ using [Equation 32].

$$\begin{aligned} x_{\ell,n} &= \arg\max_{a_{\ell,j} \in \mathcal{A}_\ell} P(x_{\ell,n} = x_{\ell,j} \mid y_n, x_n \in \hat{\mathcal{I}}_\ell) \\ &= \arg\min_{a_{\ell,j} \in \mathcal{A}_\ell} |y_n - a_{\ell,j}|^2 \end{aligned} \quad \text{[Equation 32]}$$

For the computational complexity, the most salient aspect of the embodiments of the inventive concept is that it has a linear complexity with simplicity at a block length N as shown in FIG. 14. In more detail, the inventive concept may identify an estimated support set $\hat{\mathcal{I}}_\ell$ by selecting the largest value among values of the posterior probability (APP) of N− $\sum_{j=1}^{\ell-1} K_j$ after calculating N− $\sum_{j=1}^{\ell-1} K_j$ for each element as described above. Therefore, a complexity of identifying the estimated support set $\hat{\mathcal{I}}_\ell$ can be calculated as $\mathcal{O}((N - \sum_{j=1}^{\ell-1} K_j) \log(K_\ell))$. When the estimated support set $\hat{\mathcal{I}}_\ell$ is identified, the decoding apparatus may perform detection of the maximum likelihood signal level for one layer (1-th layer) through the calculation of $|\mathcal{A}_\ell| K_\ell$. Therefore, the resulting total decoding complexity can be expressed as $\sum_{\ell=1}^{L} (N - \sum_{j=1}^{\ell-1} K_j) \log(K_\ell) + |\mathcal{A}_\ell| K_\ell$, and, under premise of N>>$K_\ell$ for $\ell \in [L]$, the number of layers and the block length may all have a linear complexity of $\mathcal{O}$ (LN).

Figure 15:
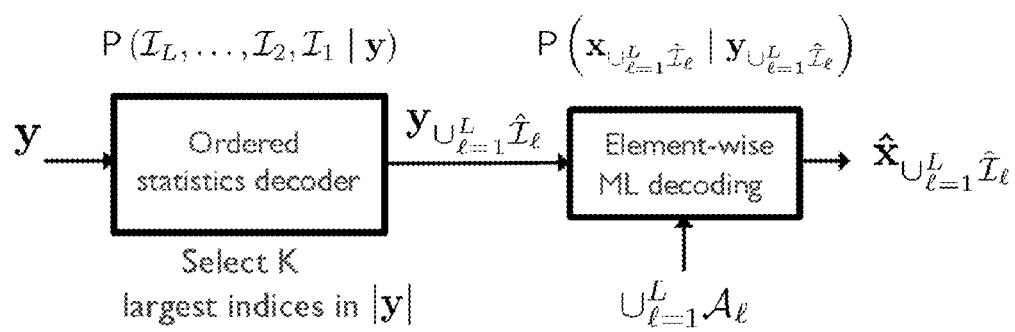
FIG. 15 is a diagram illustrating an operation of a decoding apparatus for an orthogonal sparse superposition code according to still another embodiment of the inventive concept using a probability equation.

FIG. 15 is a diagram illustrating an operation of a decoding apparatus for an orthogonal sparse superposition code according to still another embodiment of the inventive concept using a probability equation.

In addition, in order to further lower the complexity of E-MAP-SSC decoding, as shown in FIG. 15, the inventive concept may detect a support set at a non-zero position in a reception signal and identify a set of subcodewords from the detected support set. In this case, the decoding apparatus may apply the E-MAP-SSC to two-layered OSS codes using $K_1$, $K_2$, $\mathcal{A}_1=\{1\}$, and $\mathcal{A}_2=\{-1\}$. This method may be an embodiment of the decoding method described with reference to FIG. 11.

In more detail, the decoding apparatus may take an absolute value of the reception signal, detect the support set that is at the non-zero position in the descending order of absolute values, and perform the E-MAP-SSC on the detected support set. In this case, the E-MAP-SSC may operate in the same way as a simple ordered statistics decoder. For example, when the posterior probability of $n \in \mathcal{I}_1$ is calculated, [Equation 34] can be derived through [Equation 33].

$$P(y_n \mid n \in \mathcal{I}_1) = \exp\left(-\frac{(y_n - 1)^2}{2\sigma^2}\right),$$ [Equation 33]

$$P(y_n \mid n \notin \mathcal{I}_1) = \frac{(N - K_1)\exp\left(-\frac{y_n^2}{2\sigma^2}\right) + K_1 \exp\left(-\frac{(y_n + 1)^2}{2\sigma^2}\right)}{N - 2K_1},$$

$$P(n \in \mathcal{I}_1) = \frac{K_1}{N}, \text{ and } P(n \notin \mathcal{I}_1) = \frac{N - 2K_1}{N}$$

$$P(n \notin \mathcal{I}_1 \mid y_n) =$$ [Equation 34]

$$\frac{1}{1 + \exp\left(-\frac{2y_n}{\sigma^2}\right) + \frac{(N - 2K_1)}{K_1}\exp\left(-\frac{2y_n - 1}{2\sigma^2}\right)}.$$

Since $P(n \in \mathcal{I}_1 \mid y_n)$ is a monotonically increasing function of $y_n$, the index set $\hat{\mathcal{I}}_1$ may be determined by the largest value $K_1$ of $\hat{\mathcal{I}}_1$. Likewise, $K_1$ may be determined by the smallest value $K_2$ of $y_n$.

Figure 16:
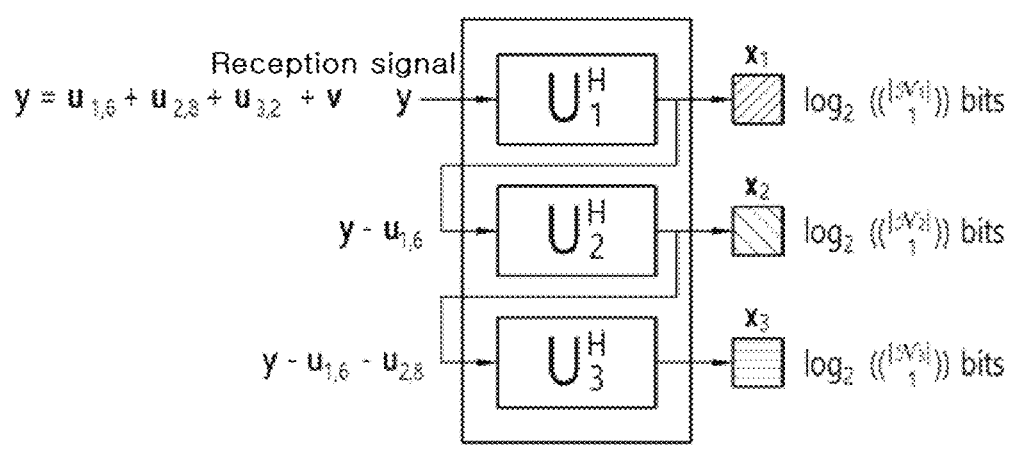
FIG. 16 is a diagram showing a parallel decoding structure using precoding according to another embodiment of the inventive concept.

FIG. 16 is a diagram showing a parallel decoding structure using precoding according to another embodiment of the inventive concept.

As shown in FIG. 16, a transmission signal x generated through a successive encoding structure using precoding shown in FIG. 8 is received as a reception signal y through a channel. Here, $x=u_{1,6}+u_{2,8}+u_{3,2}$ and $y=u_{1,6}+u_{2,8}+u_{3,2}+v$.

The decoding apparatus 200 may detect a subcodeword $x_1$ from the reception signal y using a matrix $U_1^H$.

Further, the decoding apparatus 200 may obtain $u_{1,6}$ information bits corresponding to the subcodeword $x_1$, and detect a subcodeword $x_2$ using a matrix $U_2^H$ from a signal from which $u_{1,6}$ information bits are removed from the reception signal y.

Further, the decoding apparatus 200 may obtain $u_{2,8}$ information bits corresponding to the subcodeword $x_2$, and detect a subcodeword using a matrix $U_3^H$ from a signal from which $u_{1,6}$ information bits and $u_{2,8}$ information bits are removed from the reception signal y.

Figure 17:
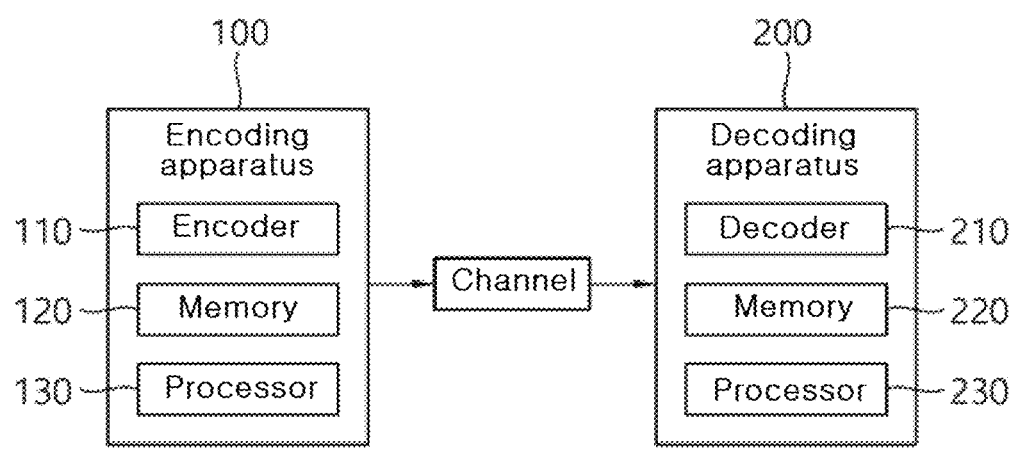
FIG. 17 is a block diagram for describing configurations of an encoding apparatus and a decoding apparatus according to an embodiment of the inventive concept.

FIG. 17 is a block diagram for describing configurations of an encoding apparatus and a decoding apparatus according to an embodiment of the inventive concept.

An embodiment of the inventive concept relates to a new class of sparse codes and orthogonal sparse superposition codes for efficiently transmitting a short information message having a small block length (e.g., less than several hundreds of bits) less than a preset size in a Gaussian channel. Orthogonal sparse superposition code, called orthogonal index superposition code is to map information bits into multiple index-modulated subcodewords in such a way that non-zero support sets of subcodewords are mutually exclusive. By taking a specific type of linear combination of these index-modulated vectors, the encoding apparatus 100 may generate an orthogonal index superposition codeword. The class of codes according to an embodiment of the inventive concept may generalize conventional classical permutation modulation codes and a recently introduced index modulation technique.

In addition, according to another embodiment of the inventive concept, a bit-wise maximum a posterior decoding with successive index cancellation (B-MAP-SIC) decoding apparatus is provided. This B-MAP-SIC decoding apparatus may have linear complexity with a block length while achieving near-optimal decoding performance. By simulation, the encoding apparatus 100 and the decoding apparatus 200 according to the embodiments of the inventive concept may outperform the classical convolutional codes using Viterbi decoding and polar codes with list decoding, especially when the code block size is less than several hundreds of bits.

As shown in FIG. 17, the encoding apparatus 100 according to an embodiment of the inventive concept may include an encoder 110, a memory 120, and a processor 130. In addition, the decoding apparatus 200 according to an embodiment of the inventive concept may include a decoder 210, a memory 220, and a processor 230. However, not all of the illustrated components are essential components. The encoding apparatus 100 and the decoding apparatus 200 may be implemented by more components than the illustrated components, and the encoding apparatus 100 and the decoding apparatus 200 may be implemented by fewer components than the illustrated components.

Hereinafter, configurations of the encoding apparatus 100 and the decoding apparatus 200 will be described sequentially.

In the encoding apparatus 100, the encoder 110 may generate bits coded using information bits, that is, a message, that is, codewords.

The memory 120 may store one or more programs associated with encoding of sparse codes and orthogonal sparse superposition codes.

The processor 130 may be connected to the encoder 110 and the memory 120 and may execute one or more programs stored in the memory 120. According to embodiments for sparse codes, the processor 130 may select an index set that is a part of a code block using information bits, and map codewords less than a preset size into the selected index set.

According to embodiments, the processor 130 may select a plurality of code positions using the information bits. The processor 130 may map a codeword less than a preset size to the union or subset of the selected index sets.

According to embodiments for orthogonal sparse superposition codes, the processor 130 may select an index set from code blocks by using the information bits in a process of successively encoding information bits in a plurality of layers. In this case, the processor 130 may select the next index set sequentially from the remaining code blocks except the previous index set that has been used in a previous layer, sequentially generate a plurality of subcodewords by allocating modulation symbols to an index set selected in each layer, and generate sparse superposition codes by combining the generated plurality of subcodewords.

According to embodiments, when sequentially generating a plurality of subcodewords, the next subcodeword may maintain orthogonality with the previous subcodeword. When a plurality of subcodewords are sequentially generated, the next subcodeword may maintain near orthogonality to the previous subcodeword. The processor 130 may generate a projection matrix corresponding to the previous index set used in the previous layer, and when energy is less than a preset delta in a case where the generated projection matrix is projected, use the corresponding index as the next index set. The processor 130 may control the degree of superposition interference by adjusting the delta value. The processor 130 may sequentially select an index set for each section in a code block which is previously divided into a plurality of sections in successively encoding information bits in a plurality of layers.

Meanwhile, in the decoding apparatus 200, the decoder 210 may obtain the decoded information bits by performing decoding on the detected codewords.

The memory 220 may store one or more programs related to the decoding of the sparse codes.

The processor 230 may be connected to the decoder 210 and the memory 220 and may execute one or more programs stored in the memory 220. According to embodiments for sparse codes, the processor 230 may sort the reception signals in the order of size, detect a preset number of uppermost or lowermost index sets from the reception signals sorted in the order of size, and perform decoding on sparse codes using the reception signals carried on the detected index sets.

According to embodiments, the processor 230 may detect subcodewords by allocating modulation symbols corresponding to elements of the detected index set. The processor 230 may determine modulation symbols corresponding to elements of the detected index set, and detect subcodewords by allocating determined modulation symbols.

According to embodiments for orthogonal sparse superposition codes, the processor 230 may detect a support set at a non-zero position in a reception signal, identify a set of subcodewords from the detected support set, and perform decoding of the identified set of subcodewords.

According to embodiments, the processor 230 may identify a set of subcodewords through comparison in size of probabilities belonging to index sets, respectively. The processor 230 may determine modulation symbols corresponding to elements of the identified set of subcodewords, and detect subcodewords by allocating the determined modulation symbols. The processor 230 may sequentially detect a support set that is at a non-zero position in the reception signal which is divided into a plurality of sections in advance. The processor 230 may sequentially detect a next support set at a non-zero position in the remaining reception signals except the previous support set used in the previous section.

Figure 18:
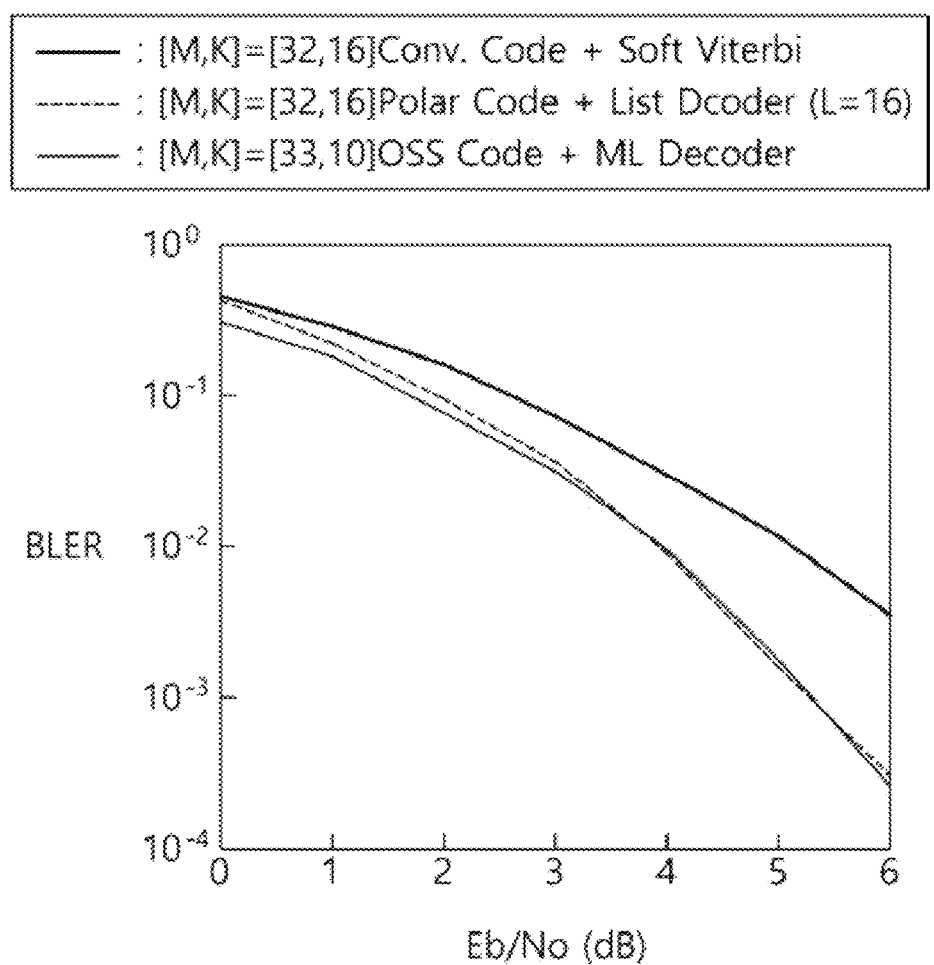
FIG. 18 is a diagram showing results of comparison between an embodiment of the inventive concept and a conventional code when a code length is 32.

FIG. 18 is a diagram showing results of comparison between an embodiment of the inventive concept and a conventional code when a code length is 32.

In FIG. 18, when a code length of 32, there is shown comparison in performance between convolutional codes 1/2 [32, 16] and polar codes 1/2 [32, 16] which are conventional codes and an embodiment of the inventive concept (OSS code). The block error rate (BLER) of the embodiment of the inventive concept (OSS code) is similar to that of the polar code.

TABLE 1

| Present Invention (OSS) | Polar code | Conv. code |
| --- | --- | --- |
| M log (2) | List × Mlog(M) | 64 × M |

When comparing code complexities, the embodiment (OSS) of the inventive concept may find out the two largest values, M*log(2), whereas the polar codes are List*Mlog (M), and the convolution codes has a code length (M) of "Soft Viterbi decoder=# of states×code length (M)=64×32."

As described above, the embodiment of the inventive concept may achieve a block error rate similar to that of polar codes, which is known near-optimal codes at a small length known in the art, while reducing the complexity by 5 to 80 times.

Figure 19:
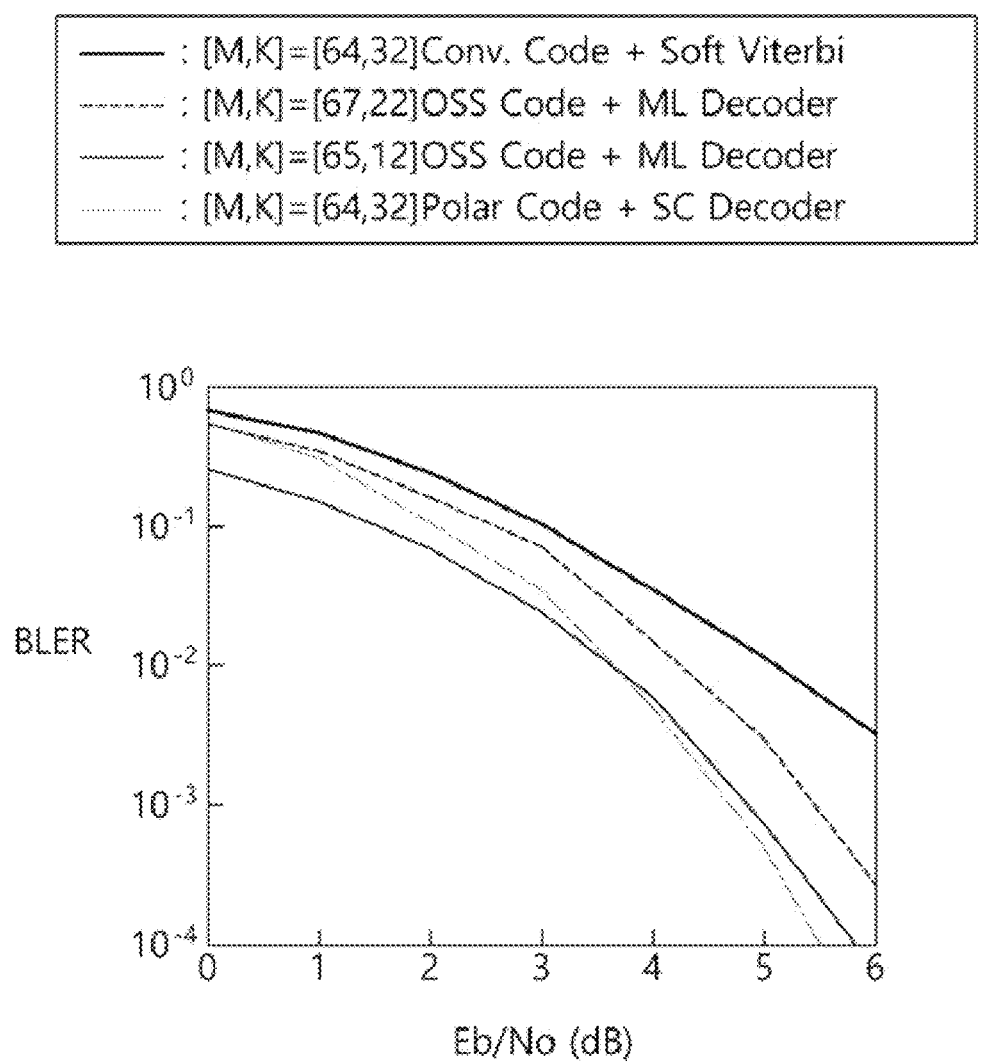
FIGS. 19 to 21 are diagrams showing results of comparison between an embodiment of the inventive concept and conventional codes when code lengths are 64, 128 and 256, respectively.
Figure 20:
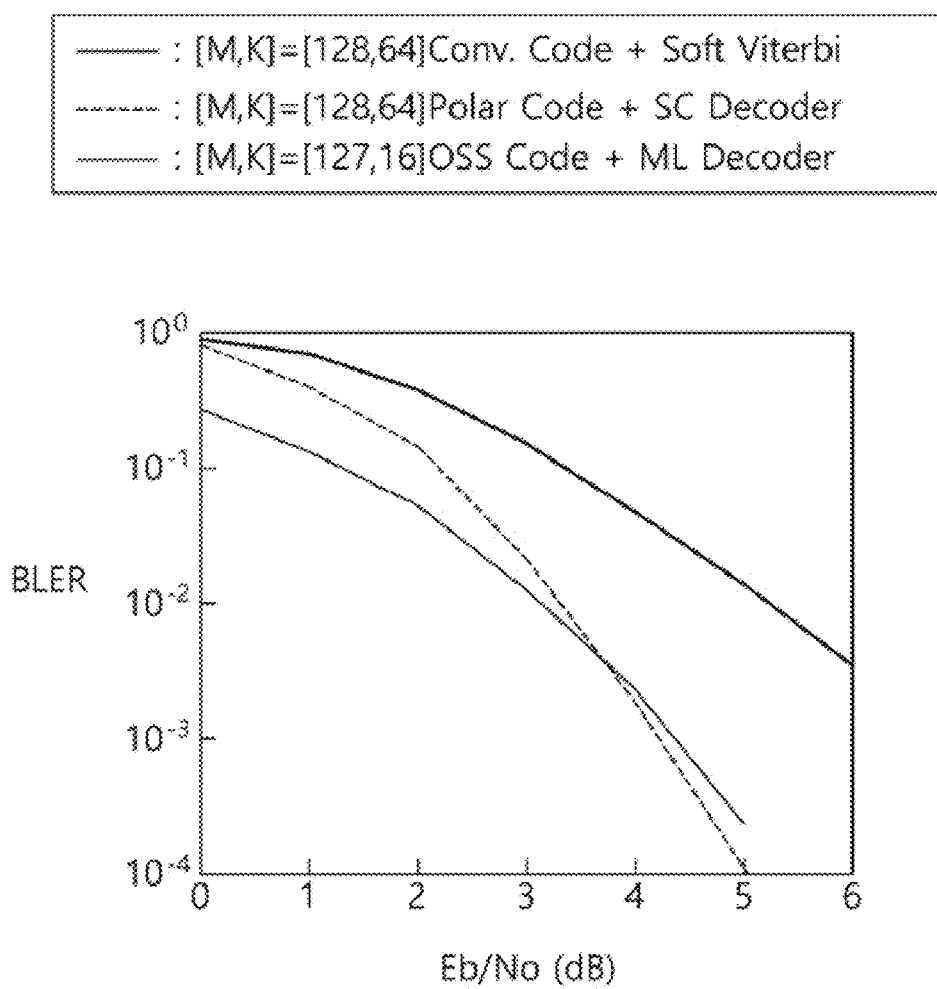
Figure 21:
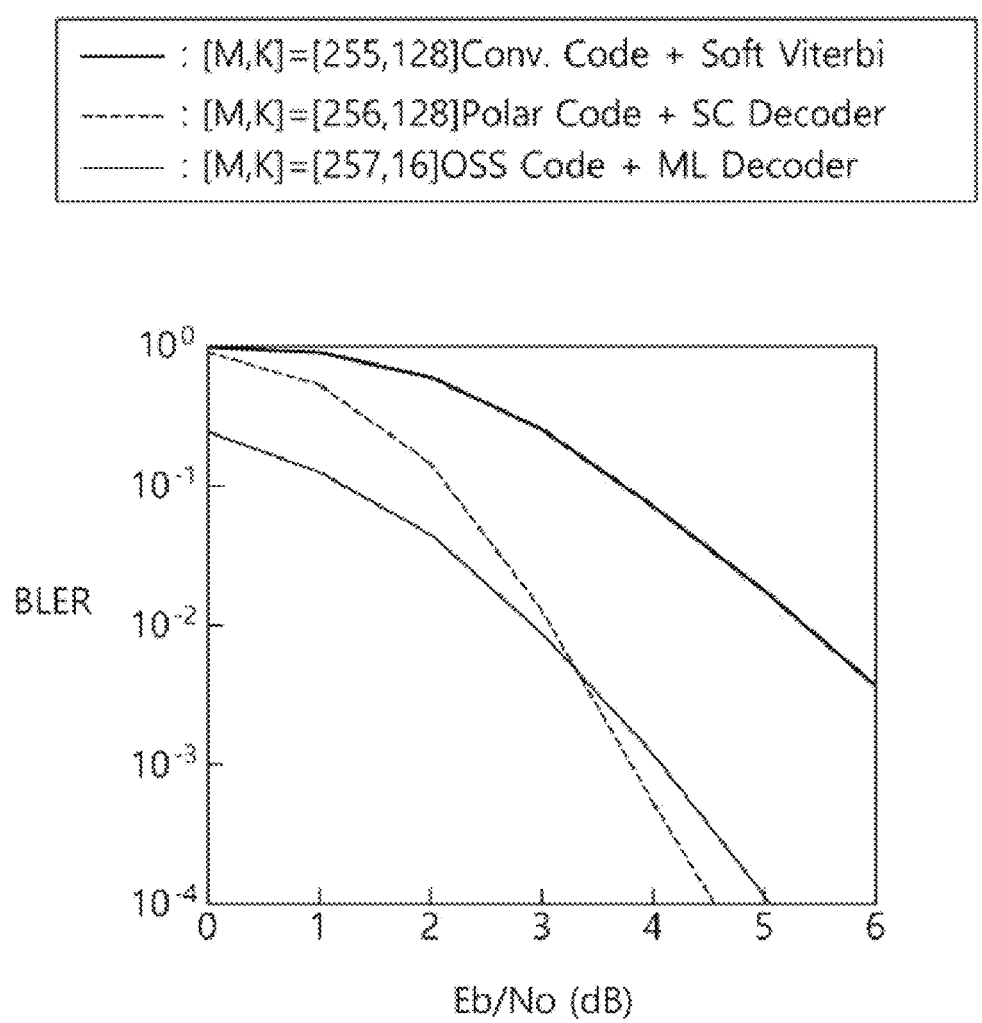

FIGS. 19 to 21 are diagrams showing results of comparison between an embodiment of the inventive concept and conventional codes when code lengths are 64, 128 and 256, respectively.

Referring to FIGS. 19 to 21, in the case of simulation, an embodiment (OSS code) of the inventive concept outperforms block error rates of classic convolutional codes using Viterbi decoding and polar codes having list decoding when a code block size is less than several hundreds of bits.

Meanwhile, there may be provided a non-transitory computer-readable storage medium for storing instructions that cause, when executed by a processor, the processor to execute a method including selecting index sets that are a part of code blocks using information bits, and mapping codewords less than a preset size to the selected index sets.

Further, there may be provided a non-transitory computer-readable storage medium for storing instructions that cause, when executed by a processor, the processor to execute a method including selecting an index set from code blocks using information bits in successively encoding the information bits in a plurality of layers and sequentially selecting a next index set from remaining code blocks except a previous index set used in a previous layer, sequentially generating a plurality of subcodewords by allocating modulation symbols to index sets selected by the layers respectively, and generating sparse superposition codes by combining the generated plurality of subcodewords.

As described above, in the case where the code block length is a finite length, the inventive concept may represent the BLER as in [Equation 35] for a single layered OSS code having a rate of $$R = \frac{\left\lfloor \log_2\left(\binom{N}{K_1}\right) \right\rfloor}{N}.$$

[Equation 35]

$$P(\varepsilon) = 1 - \frac{(N-K_1)}{\sqrt{2\pi\sigma^2}} \int_{-\infty}^{\infty} Q\left(\frac{y-1}{\sigma}\right)^{K_1} \left\{1 - Q\left[\left(\frac{y}{\sigma}\right)\right]\right\}^{N-K_1-1} e^{-\frac{y^2}{2\sigma^2}} dy,$$

-continued where $Q(x) = \int_x^\infty \frac{1}{\sqrt{2x}} e^{-\frac{x^2}{2}} du$ In addition, the inventive concept may provide a tight upper bound for a two-layered OSS code. For example, for a two-layered OSS code with a rate of $$R = \frac{\lfloor \log_2(\binom{N}{K}) \rfloor + \lfloor \log_2(\binom{N-K}{K}) \rfloor}{N},$$

the BLER may have a tight upper bound such as [Equation 36].

$$P(\varepsilon) \leq 1 - \left(1 - Q\left(\frac{1}{\sigma}\right)\right)^{2K} \frac{(N-2K)}{\sqrt{2\pi\sigma^2}}$$ [Equation 36]

$$\int_0^\infty Q_{\frac{1}{2}}\left(\frac{1}{\sigma}, \frac{\sqrt{y}}{\sigma}\right)^{2K} \left\{1 - 2Q\left(\frac{\sqrt{y}}{\sigma}\right)\right\}^{N-2K-1} y^{-\frac{1}{2}} e^{-\frac{y}{\sigma^2}} dy,$$

where $Q_M(a, b)$ denotes the generalized Marcum $Q$- function of order $M$

As described above, the inventive concept may analyze code error performance in a certain code length in an analytical form. In a communication system that requires high reliability while transmitting short packets such as IoT, the minimum Eb/N0 required to achieve the performance of BLER 10-9 needs to be calculated. Accordingly, the inventive concept capable of predicting code error performance in an analytical form without relying on experimental results may meet the needs of recent communication systems.

In addition, the inventive concept, which is a single layered OSS code of $$R = \frac{\log_2(\binom{N}{K})}{N},$$

may achieve the Shannon limit of the power-limited regime with linear decoding complexity when a code block length is infinite.

In addition, the feature of the inventive concept is to obtain a coding gain such as a bi-orthogonal coded known as a code capable of achieving the Shannon limit in a power-limited regime. As an example, since the OSS code of the inventive concept is $$d_{min}^2(C) = 2, E_s = \frac{1}{N}, \text{ and } R = \frac{\log_2 N}{N},$$

under the assumption of the length is N and the single-layered orthogonal sparse superposition code is $K_1=1$, the nominal coding gain may be calculated as [Equation 37].

$$\gamma_c^{oss} = \frac{d_{min}^2(C)/4}{E_s/R} = \frac{\log_2 N}{2}$$ [Equation 37]

Since the normalized number of the nearest neighbors per bit is $$\frac{N-1}{\log_2 N},$$

the effective coding gain of the code of the inventive concept is expressed as in [Equation 38].

$$\gamma_{eff}^{oss} = 10 \log_{10}\left(\frac{\log_2 N}{2}\right) - 0.2 \log_2\left(\frac{N-1}{\log_2 N}\right) dB.$$ [Equation 38]

As described above, the inventive concept not only obtains a coding gain such as bi-orthogonal coded, but also achieve a complexity of O(N) which is a complexity much less than O(NlogN) (assuming a code length of N) that is the complexity of the optimal low-complexity decoding (Hadamard transform decoding) of a bi-orthogonal code (also referred to as 1st-order Reed-Muller code).

Figure 22:
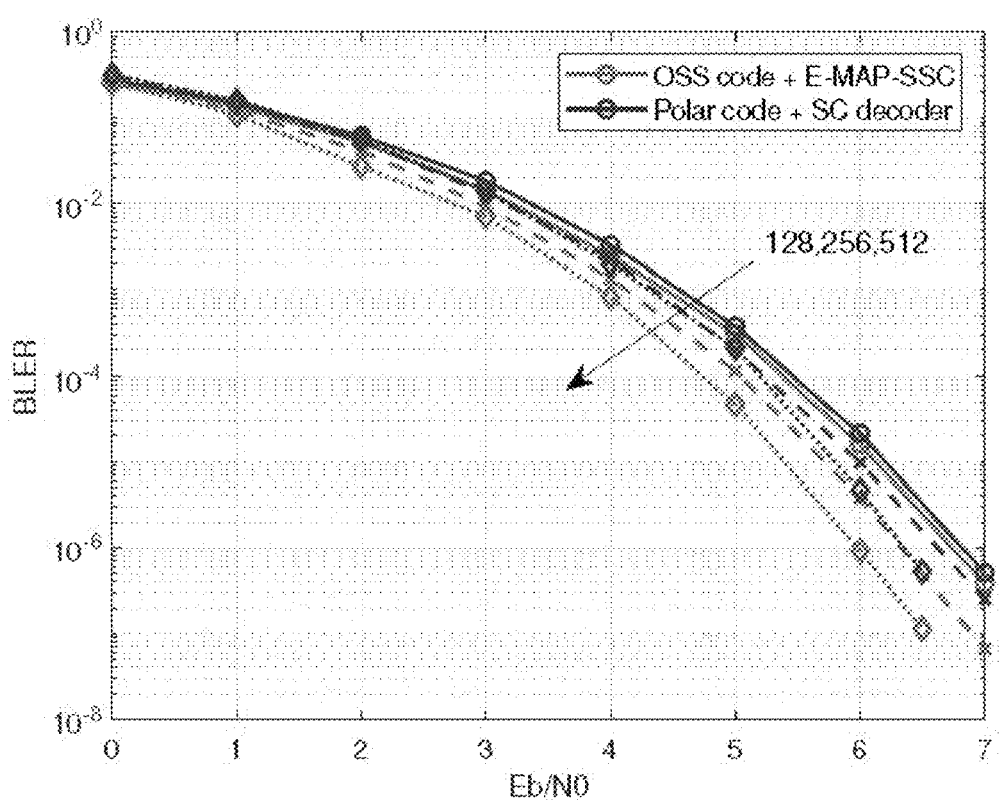
FIG. 22 is a diagram showing a result of comparison between an embodiment of the inventive concept and a conventional code when a block length increases while lowering a code rate.

FIG. 22 is a diagram showing a result of comparison between an embodiment of the inventive concept and a conventional code when a block length increases while lowering a code rate.

Referring to the drawing, the BLER between the OSS code of the inventive concept using the E-MAP-SSC and the 1/2-polar code using the SC decoder may be compared for different block lengths as shown in the drawing.

The inventive concept exhibits better performance than polar codes at block lengths of 128, 256, and 512, and decoding complexity is also less complex than polar codes.

Figure 23:
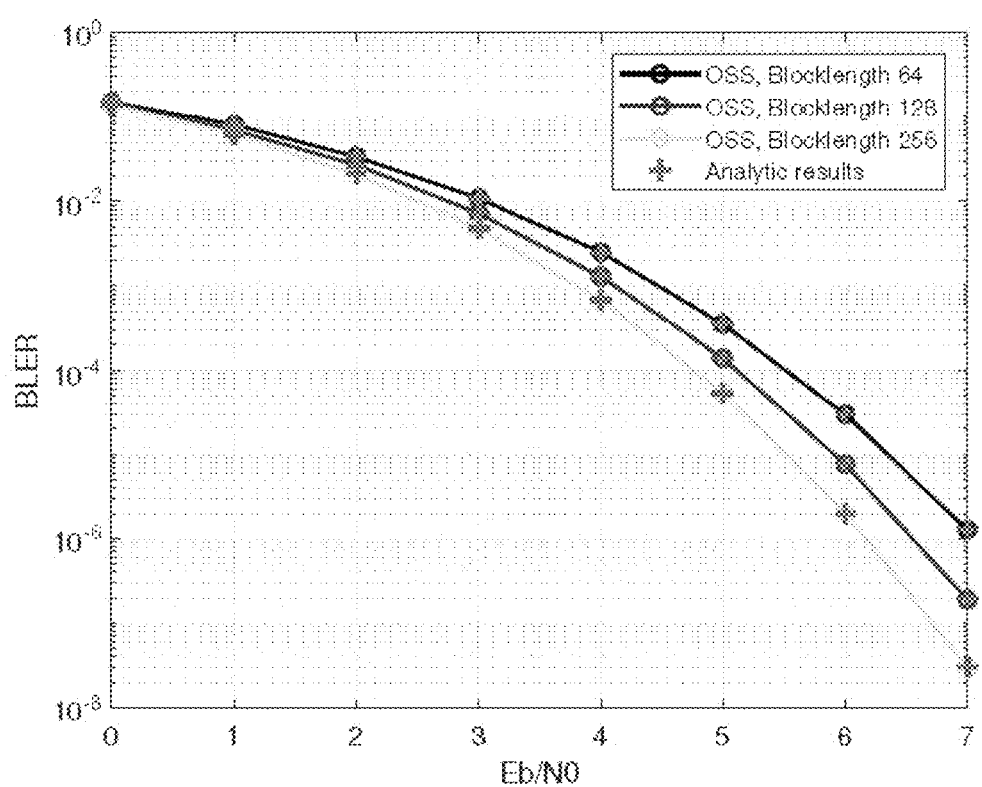
FIG. 23 is a diagram showing analysis of BLER for a single layered orthogonal sparse superposition code.
Figure 24:
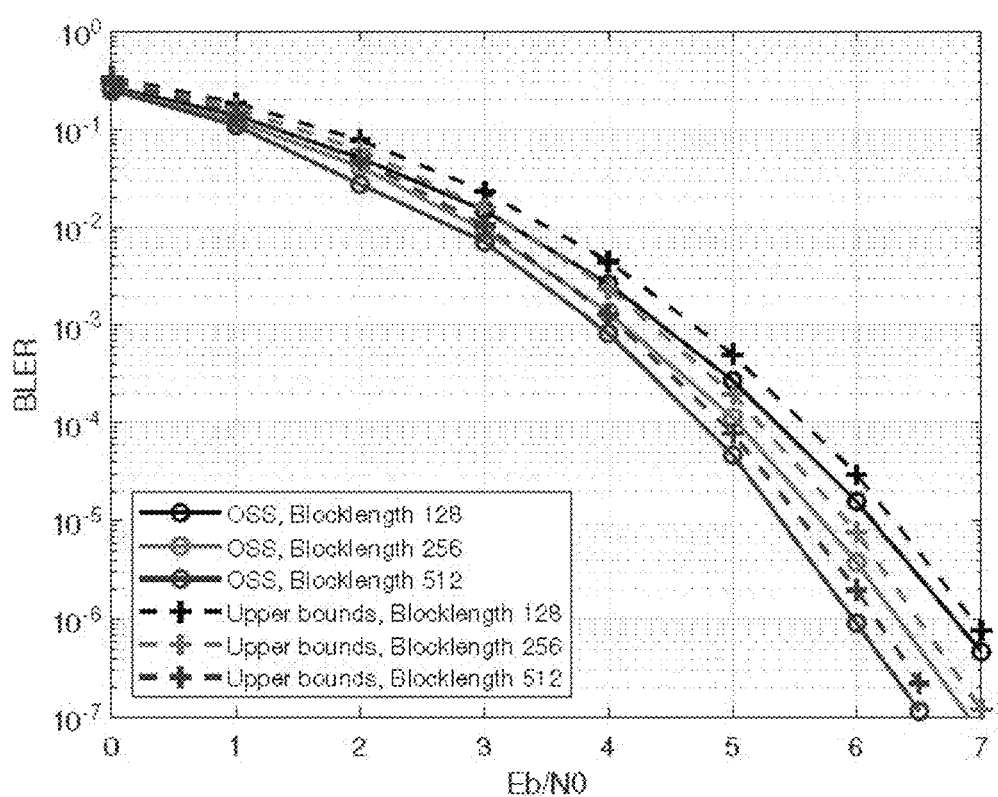
FIG. 24 is a diagram showing analysis of BLER for a two-layered orthogonal sparse superposition code.
Figure 25:
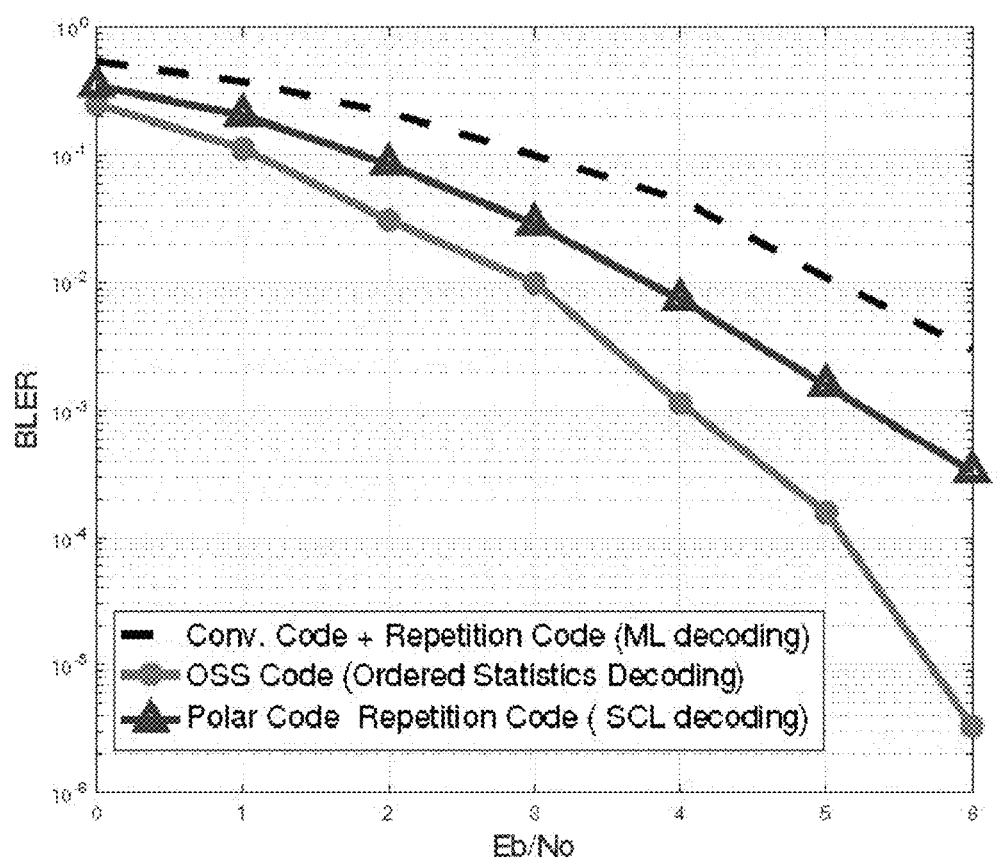
FIG. 25 is a diagram showing a result of comparison between an embodiment of the inventive concept and a conventional code when a code length is 256.

FIG. 23 is a diagram showing analysis of BLER for a single layered orthogonal sparse superposition code, FIG. 24 is a diagram showing analysis of BLER for a two-layered orthogonal sparse superposition code, and FIG. 25 is a diagram showing a result of comparison between an embodiment of the inventive concept and a conventional code when a code length is 256.

Referring to the drawings, the inventive concept using the OSS code may obtain a large coding gain due to linear decoding complexity, compared to a low-rate code (repetition code+convolution code; polar code) used in an existing LTE control channel, when comparing performance with an existing code in terms of SNR per bit (e.g., $E_b/N_0$).

Meanwhile, according to an embodiment of the inventive concept, the various embodiments described above may be implemented as software including instructions stored in a machine-readable storage media. The machine may be a device capable of calling a stored instruction from a storage medium and operating in accordance with the called instruction, and may include an electronic device (e.g., the electronic device A) according to the disclosed embodiments. The instructions, when executed by a processor, may cause the processor to perform a function corresponding to the instruction directly or using other components under the control of the processor. The instruction may include codes generated or executed by a compiler or interpreter. The machine-readable storage medium may be provided in the form of a non-transitory storage medium. Here 'non-temporary' means that the storage medium does not include a signal and is tangible, and does not distinguish whether data is stored semi-permanently or temporarily on the storage medium.

Further, according to an embodiment of the inventive concept, the method according to the various embodiments described above may be included in a computer program product and provided. The computer program product may be traded between a seller and a buyer as a product. The computer program product may be distributed online in the form of a machine-readable storage medium (e.g., compact disc read only memory (CD-ROM)) or through an application store (e.g., Play Store™). In the case of online distribution, at least a part of the computer program product may be temporarily generated or at least temporarily stored in a storage medium, such as a memory of a manufacturer's server, an application store's server, or a relay server.

Also, various embodiments described herein may be embodied in a computer or similar device-readable recording medium using software, hardware, or a combination thereof. In some cases, the embodiments described herein may be implemented by a processor itself. According to software implementation, embodiments such as procedures and functions described herein may be implemented as separate software modules. Each of the software modules may perform one or more functions and operations described herein.

Meanwhile, computer instructions for performing a processing operation of a device according to the various embodiments described above may be stored in a non-transitory computer-readable medium. The computer instructions stored in the non-transitory computer-readable medium cause, when executed by a processor of a specific device, the specific device to perform processing operations in the device according to the various embodiments described above. The non-transitory computer readable-medium refers to a medium that stores data semi-permanently rather than a medium storing data for a very short time, such as a register, a cache, and a memory, and is readable by an apparatus. Specific examples of the non-transitory computer-readable media may include CD, DVD, hard disk, Blu-ray disk, USB, memory card, ROM, and the like.

Further, each component (e.g., a module or a program) according to various embodiments described above may be composed of single entity or a plurality of entities, a part of the above-described sub-components may be omitted, or other sub-components may be further included in various embodiments. Alternatively or additionally, some components (e.g., modules or programs) may be integrated into one entity to perform the same or similar functions performed by the components prior to integration. Operations performed by a module, a program, or other components according to various embodiments may be executed sequentially, in parallel, repeatedly, or in a heuristic method. In addition, some operations may be executed in different sequences or may be omitted. Alternatively, other operations may be added.

While the present disclosure has been shown and described with reference to various embodiments thereof, the inventive concept is not limited to the specific embodiments described above. Various modifications can be implemented by those of ordinary skill in the technical field belonging to the present disclosure without departing from the gist of the inventive concept claimed in the claims, and these modifications should not be individually understood from the technical idea or perspective of the inventive concept.

The disclosed technology may have the following effects. However, since a specific embodiment does not mean to include all of the following effects or only the following effects, it should not be understood that the scope of the disclosed technology is limited by this.

Embodiments of the inventive concept may simultaneously obtain a coding gain and a power gain in a short block length.

Embodiments of the inventive concept may increase the power gain by providing sparse codes and orthogonal sparse superposition codes in which most of transmission codewords are zero and a non-zero portion is small.

Embodiments of the inventive concept may increase the coding gain by using maximum distance separable (MDS) codes having a large coding gain in the non-zero portion or by using a certain conventional code.

Although the embodiments of the inventive concept have been described for short-length codes, the decoding method according to the embodiments of the inventive concept may achieve linear decoding complexity in the block lengths even for a very long block length, and be very useful for THz communication systems (a large number of received samples and power-limited regime).

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A sparse code encoding method which is to be performed by an encoding apparatus, comprising:
    dividing, by a bit splitter, a plurality of information bits into multiple information bits, including a first information bit having a first length and a second information bit having a second length;
    selecting an index set that is a part of a code block by using the first information bit;
    generating a sparse code, wherein the generating comprises mapping a codeword less than a preset size to the selected index set;
    generating, by an encoder, a codeword using the second information bit; and
    generating a modulated codeword by performing modulation, wherein performing the modulation comprises allocating a modulation symbol to the generated codeword,
    wherein:
    the dividing, the selecting, and the generating are part of the sparse code encoding method performed at the encoding apparatus;
    the code block comprises elements associated with code positions;
    each of the elements is represented consecutively at a corresponding code position of the code positions;
    the selecting of the index set includes selecting one or more elements at corresponding one or more code positions in the code block using the first information bit;
    the index set represents the one or more code positions in the code block;
    the one or more code positions are one or more non-zero positions in the code block;
    the elements comprise the one or more elements, and the code positions comprise the one or more code positions;
    the codeword less than the preset size represents a sub-codeword; and
    mapping the codeword less than the preset size to the selected index set comprises mapping the modulated codeword to the selected index set.

2. An orthogonal sparse superposition code encoding method which is to be performed by an encoding apparatus, comprising:

encoding a plurality of information bits into encoded information bits;

dividing the encoded information bits into multiple information bits, including a first encoded information bit;

selecting a first index set from a first code block in a first layer using the first encoded information bit, and sequentially selecting a next index set from a next code block in a next layer of one or more remaining code blocks using a next encoded information bit, wherein each of the first index set and the next index set is mutually exclusive so that the first index set and the next index set are different from one another, wherein layers comprise the first layer, the next layer, and one or more remaining layers;

sequentially generating a plurality of subcodewords by allocating modulation symbols to index sets selected in the layers respectively; generating a sparse superposition code by combining the generated plurality of subcodewords; and performing power spreading of the generated sparse superposition code using unitary transform to spread transmit power over channel use, wherein:

the encoding, the dividing, the selecting, the sequentially generating, and the generating are part of the orthogonal sparse superposition code encoding method performed at the encoding apparatus;

each of the first code block and the next code block comprises elements associated with code positions;

each of the elements is represented consecutively at a corresponding code position of the code positions;

the selecting of the first index set includes selecting one or more elements at corresponding one or more code positions in the first code block using the first encoded information bit;

the first index set represents the one or more code positions in the first code block;

the one or more code positions in the first code block are one or more non-zero positions in the first code block; and the elements of the first code block comprise the one or more elements of the first code block, and the code positions of the first code block comprise the one or more code positions in the first code block.

3. The orthogonal sparse superposition code encoding method of claim 2, wherein a next subcodeword maintains orthogonality with a first subcodeword when the plurality of subcodewords are sequentially generated.

4. The orthogonal sparse superposition code encoding method of claim 2, wherein a next subcodeword maintains near-orthogonality with a first subcodeword when the plurality of subcodewords are sequentially generated.

5. The orthogonal sparse superposition code encoding method of claim 4, wherein the sequentially selecting of the next index set includes generating a projection matrix corresponding to the first index set used in the first layer, and when energy is less than a preset delta in a case where the generated projection matrix is projected, using a corresponding index as the next index set.

6. The orthogonal sparse superposition code encoding method of claim 5, wherein the sequentially selecting of the next index set includes controlling a degree of superposition interference by adjusting the delta.

7. The orthogonal sparse superposition code encoding method of claim 2, wherein the sequentially selecting of the next index set includes sequentially selecting an index set for each section in a code block which has been divided into a plurality of sections.

8. A sparse code decoding method which is to be performed by a decoding apparatus, comprising:

sorting reception signals in an order of size;

detecting a preset number of uppermost or lowermost index set from the reception signals sorted in the order of size; and performing decoding on a sparse code by using a reception signal carried on the detected index set, wherein:

the reception signals comprise positions that are consecutive;

each of the reception signals is associated with a corresponding position of the positions;

sorting the reception signals comprises re-ordering the positions of the reception signals in an order of a size of each of the reception signals at the corresponding position;

the uppermost index set represents uppermost one or more positions in the reception signals after the re-ordering;

the lowermost index setrepresent lowermost one or more positions in the reception signals after the re-ordering;

the size of the reception signal carried on the uppermost index set is larger than the size of the reception signal carried on the lowermost index set;

the detected index set is the uppermost index set or the lowermost index set;

the performing of the decoding includes detecting a subcodeword by allocating a corresponding modulation symbol to an element of the detected index set; and the element of the detected index set corresponds to the reception signal carried on the detected index set.

9. The sparse code decoding method of claim 8, wherein the performing of the decoding includes determining the modulation symbol corresponding to the element of the detected index set.

10. An orthogonal sparse superposition code decoding method which is to be performed by a decoding apparatus, comprising:

detecting a support set that is a non-zero position from a reception signal;

identifying a set of subcodewords from the detected support set; and performing decoding on the identified set of subcodewords, wherein:

the reception signal comprises elements associated with positions that are consecutive;

each of the elements is associated with a corresponding position of the positions;

the identifying of the set of subcodewords includes identifying the set of subcodewords through comparison of a size of probabilities belonging to each support set;

each support set represents a position in the reception signal that is a non-zero position in the reception signal; and the performing of the decoding includes determining a modulation symbol corresponding to an element of the identified set of subcodewords and detecting a subcodeword by allocating the determined modulation symbol to the element.

11. The orthogonal sparse superposition code decoding method of claim 10, wherein the detecting of the support set includes sequentially detecting a support set that is a non-zero position for each section from a reception signal which has been divided into a plurality of sections.

12. The orthogonal sparse superposition code decoding method of claim 10, wherein the detecting of the support set includes sequentially detecting a next support set that is a non-zero position from remaining reception signals except a previous support set used in a previous section.

* * * * *